United States Patent
Kato et al.

(10) Patent No.: US 7,157,773 B2
(45) Date of Patent: Jan. 2, 2007

(54) NONVOLATILE SEMICONDUCTOR MEMORY DEVICE

(75) Inventors: Hiroshi Kato, Hyogo (JP); Shigehiro Kuge, Hyogo (JP); Hideyuki Noda, Hyogo (JP); Fukashi Morishita, Hyogo (JP); Shuichi Ueno, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/330,093

(22) Filed: Dec. 30, 2002

(65) Prior Publication Data
US 2004/0007734 A1    Jan. 15, 2004

(30) Foreign Application Priority Data
Jul. 5, 2002    (JP) ............... 2002-197062

(51) Int. Cl.
*H01L 27/01* (2006.01)

(52) U.S. Cl. ............ 257/347; 257/324; 257/411

(58) Field of Classification Search ........ 257/296–326, 257/347, 411
See application file for complete search history.

(56) References Cited

U.S. PATENT DOCUMENTS

| | | | |
|---|---|---|---|
| 4,173,766 A | | 11/1979 | Hayes |
| 5,359,219 A | * | 10/1994 | Hwang |
| 5,656,845 A | * | 8/1997 | Akbar ............ 257/347 |
| 5,768,192 A | | 6/1998 | Eitan |
| 6,011,725 A | | 1/2000 | Eitan |
| 6,081,456 A | | 6/2000 | Dadashev |
| 6,191,445 B1 | * | 2/2001 | Fujiwara |
| 6,314,021 B1 | * | 11/2001 | Maeda et al. |
| 6,661,065 B1 | * | 12/2003 | Kunikiyo ............ 257/411 |
| 6,809,374 B1 | * | 10/2004 | Takamura |
| 6,870,225 B1 | * | 3/2005 | Bryant et al. |

FOREIGN PATENT DOCUMENTS

| | | |
|---|---|---|
| JP | 7-50396 | 2/1995 |
| JP | 8-172199 | 7/1996 |
| JP | 10-163349 | 6/1998 |
| JP | 2000-091331 | 3/2000 |
| KR | 1999-0045036 | 6/1999 |

OTHER PUBLICATIONS

DEvice Electronics for Integrated circuits, Second edition, Richard S. Muller, Theodore L. karmins, p. 399 (1986).*
U.S. Appl. No. 10/146,021, filed May 16, 2002.
U.S. Appl. No. 10/146,031, filed May 16, 2002.
U.S. Appl. No. 10/211,338, filed Aug. 5, 2002.
U.S. Appl. No. 10/216,729, filed Aug. 13, 2002.
U.S. Appl. No. 10/222,865, filed Aug. 19, 2002.
U.S. Appl. No. 10/319,520, filed Dec. 16, 2002.
U.S. Appl. No. 10/326,141, filed Dec. 23, 2002.
U.S. Appl. No. 10/298,666, filed Nov. 19, 2002.

* cited by examiner

*Primary Examiner*—Nathan J. Flynn
*Assistant Examiner*—Kevin Quinto
(74) *Attorney, Agent, or Firm*—Buchanan Ingersoll & Rooney PC

(57) ABSTRACT

A memory cell of a nonvolatile semiconductor memory device is formed on a silicon layer formed on a silicon substrate through an ONO film. The memory cell has a source region and a drain region formed in the silicon layer, an ONO film and a gate electrode. The ONO film and the ONO film include nitride films having charge trap parts trapping charges.

13 Claims, 16 Drawing Sheets

NONVOLATILE SEMICONDUCTOR MEMORY DEVICE

BACKGROUND OF THE INVENTION

1. Field of the Invention

The present invention relates to a nonvolatile semiconductor memory device, and more specifically, it relates to a nonvolatile semiconductor memory device comprising a MONOS (metal oxide nitride oxide semiconductor) memory cell.

2. Description of the Background Art

A generally known nonvolatile semiconductor memory device comprises a memory cell having a gate structure obtained by stacking a floating gate 20 and a control gate 21, as shown in FIG. 25. This memory cell has a source region 4, a drain region 5 and the aforementioned multilayer gate formed on the main surface of a silicon substrate 1. The floating gate 20 is formed on the main surface of the silicon substrate 1 through an insulator film, and the control gate 21 is formed on the floating gate 20 through an insulator film 22. An insulator film 23 covers the control gate 21 and the floating gate 20.

FIG. 26 shows another conventional nonvolatile semiconductor memory device having a MONOS memory cell, which has been recently proposed.

As shown in FIG. 26, this memory cell has an insulator film (hereinafter referred to as "ONO film") 6 consisting of a multilayer structure of an oxide film 6a, a nitride film 6b and an oxide film 6c between a gate 7 and a channel. Electrons are injected into or extracted from the nitride film 6b forming the ONO film 6, thereby writing (programming) or erasing data in or from the memory cell. The nitride film 6b is an insulator film, and hence electrons once trapped in the nitride film 6b remain unmoving.

The aforementioned MONOS memory cell has the following advantages: The memory cell can be readily fabricated at a low cost. Two bits/cell can be implemented by trapping electrons on two physically different positions of a single cell. More specifically, electron trap parts R and L can be secured on right and left portions of the nitride film 6b as shown in FIG. 26, for writing data by trapping electrons in the electron trap parts R and L. When the direction of a current fed to the channel is switched in writing and reading, the quantity of change of a threshold voltage is increased with respect to the quantity of electron injection.

Data is written in the MONOS memory cell through channel hot electrons (CHE), and erased through an F-N (Fowler-Nordheim) tunneling phenomenon.

Electrons are injected into the electron trap parts (electron trap regions) R and L provided on the right and left portions of the memory cell shown in FIG. 26, for performing writing. The electrons injected into the electron trap parts R and L remain unmoving in the nitride film 6b, and hence two bits can be written in one cell by inverting source/drain.

In order to erase data, electrons are extracted from the electron trap parts R and L through the F-N tunneling phenomenon. Thus, erasing is performed in units of bits. When performing reading as to each bit and setting a gate voltage to a prescribed value, data of a focused bit can be correctly read regardless of data of the remaining bit. U.S. Pat. No. 6,081,456, for example, discloses a method of applying voltages to respective terminals of the memory cell shown in FIG. 26.

FIG. 27 shows another MONOS memory cell having an islandlike oxide film 24 containing silicon as an electrode trap layer.

The quantity of electrons injected into the floating gate 20 of a conductor in the memory cell shown in FIG. 25 depends on readily controllable factors such as a write voltage, a write time, the thickness of an oxide film etc. In other words, the quantity of electron injection is hardly dispersed in fabrication steps in principle.

In the MONOS memory cell, however, the quantity of electron injection may also depend on the crystal defect level of the nitride film 6b in addition to the aforementioned factors. If the crystal defect level is low, no desired quantity of threshold voltage change can be obtained by increasing the write voltage or the write time.

When a desired quantity of threshold voltage change can be obtained, a threshold voltage distribution margin can be ensured between an erased state ('1') and a written state ('0'), as shown in FIG. 28. When no desired quantity of threshold voltage change can be obtained, however, no threshold voltage distribution margin can be ensured between the erased state ('1') and the written state ('0') but '1' and '0' may be falsely recognized in any bit as shown in FIG. 29. A product including a bit having such threshold voltage distribution results in reduction of the yield of the product.

SUMMARY OF THE INVENTION

The present invention has been proposed in order to solve the aforementioned problem. An object of the present invention is to provide a nonvolatile semiconductor memory device capable of ensuring a desired threshold voltage distribution margin between an erased state and a written state of a memory cell.

The nonvolatile semiconductor memory device according to the present invention, including a memory cell, comprises a semiconductor substrate, a semiconductor layer, located above the semiconductor substrate, including a source region, a channel region and a drain region of the memory cell, and a lower insulator film located between the semiconductor substrate and the semiconductor layer.

A memory cell current can be increased by forming the semiconductor layer on the lower insulator film as hereinabove described, i.e., by employing an SOI (silicon on insulator) structure. Therefore, a charge trap part can trap a large quantity of electrons for increasing the quantity of threshold voltage change of the memory cell.

The nonvolatile semiconductor memory device has an insulator film on the aforementioned channel region, and this insulator film can include a first charge trap insulator film capable of trapping charges. According to this structure, charges can be stably trapped in the first charge trap insulator film.

The aforementioned lower insulator film preferably has a second charge trap insulator film capable of trapping charges. This lower insulator film has a multilayer structure of a first insulator film, the second charge trap insulator film and a second insulator film, for example. Preferably, the first and second charge trap insulator films are nitride films. The nonvolatile semiconductor memory device is preferably provided with a lower electrode applying a potential to the second charge trap insulator film for trapping charges. This lower electrode includes a polysilicon film or an impurity diffusion region. Charge trap regions in the aforementioned second charge trap insulator film are preferably provided on a region including a portion corresponding to the boundary between the source region and the channel region and a region including a portion corresponding to the boundary between the drain region and the channel region in plan view in the second charge trap insulator film. Carriers of the aforementioned charges are generally electrons, and "charges" in the charge trap insulator film or the like may be replaced with "electrons".

The aforementioned nonvolatile semiconductor memory device further comprises a gate electrode (wiring part) of the memory cell on the insulator film for applying a potential to the first charge trap insulator film for trapping charges. In this case, the lower insulator film preferably has a second charge trap insulator film. The aforementioned insulator film preferably has a multilayer structure of a first insulator film, the first charge trap insulator film and a second insulator film, and the lower insulator film preferably has a multilayer structure of a third insulator film, the second charge trap insulator film and a fourth insulator film.

At least either the aforementioned first charge trap insulator film or the aforementioned second charge trap insulator film is formed by a nitride film. The electric capacitance of at least one of the aforementioned first, second, third and fourth insulator films may be different from the electric capacitances of the remaining insulator films.

The aforementioned nonvolatile semiconductor memory device may further comprise a lower electrode applying a potential to the second charge trap insulator film for trapping charges. This lower electrode includes a polysilicon film or an impurity diffusion region. In the first and second charge trap insulator films, first and second charge trap regions are preferably provided on both of a region including a portion corresponding to the interface between the aforementioned source region and the channel region and a region including a portion corresponding to the interface between the aforementioned drain region and the channel region in plan view. Each of the first and second charge trap insulator films does not necessarily include a single charge trap region but generally has two charge trap regions. Further, each of the first and second charge trap insulator films may include at least three charge trap regions.

The aforementioned "region including a portion corresponding to the interface between the source region and the channel region" may be any of (a1) a region corresponding to the aforementioned interface, (a2) a region reaching the source region from the portion corresponding to the aforementioned interface and (a3) a region reaching the channel region from the portion corresponding to the aforementioned interface in each of the aforementioned first and second charge trap insulator films, or a combination of these regions (a1) to (a3). This also applies to the "region including a portion corresponding to the interface between the drain region and the channel region".

The nonvolatile semiconductor memory device according to the present invention is capable of storing information of four bits in a single memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to FIGS. 1 to 24. In the following description of each embodiment, the present invention is applied to a nonvolatile semiconductor device comprising a MONOS memory cell.

(First Embodiment)

In general, a nonvolatile semiconductor memory device has a memory cell region (memory cell array) formed with memory cells (memory cell transistors) and a peripheral circuit region formed with a peripheral circuit controlling operations of the memory cells.

Figure 1:
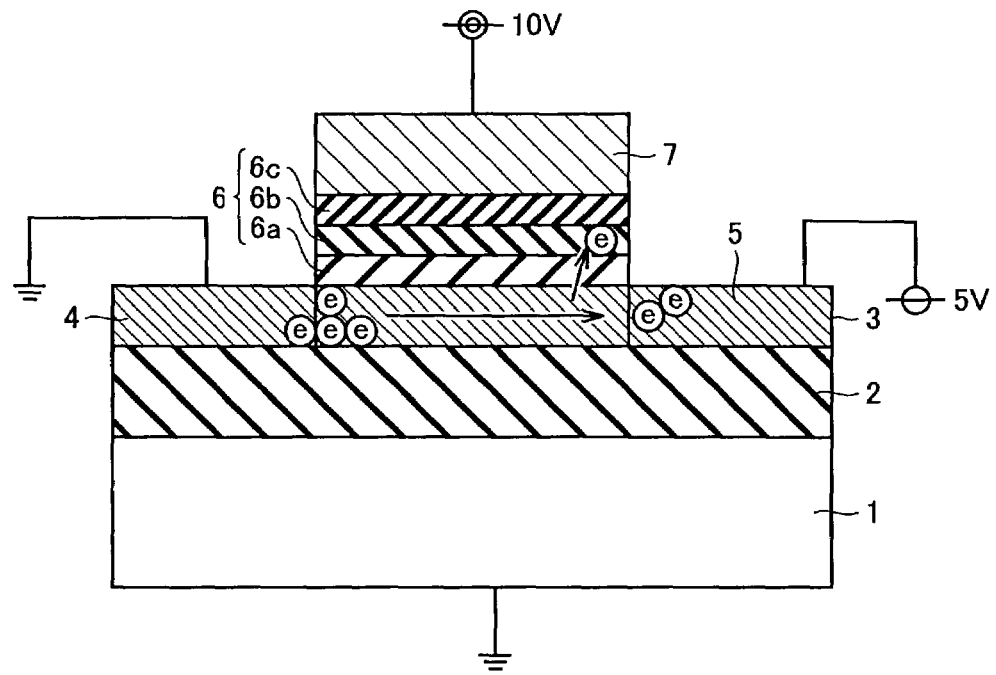
FIG. 1 is a sectional view of a memory cell of a nonvolatile semiconductor memory device according to a first embodiment of the present invention.

FIG. 1 illustrates an exemplary sectional structure of a memory cell of a nonvolatile semiconductor memory device according to a first embodiment of the present invention.

As shown in FIG. 1, the memory cell is formed on a silicon layer (a semiconductor layer or an SOI (silicon on insulator) layer) 3 formed on the main surface of a p-type silicon substrate (semiconductor substrate) 1 through an insulator film 2 such as a silicon oxide film. This memory cell has a source region (impurity diffusion region) 4 and a drain region (impurity diffusion region) 5 formed at a space to define a channel region, an ONO film 6 and a gate electrode 7.

The source region 4 and the drain region 5 can be formed by selectively injecting an impurity into the silicon layer 3. When the memory cell is an n-channel MOS (metal oxide semiconductor) transistor, for example, the source region 4 and the drain region 5 are formed by n-type (first conductivity type) impurity diffusion regions. At this time, a p-type (second conductivity type) impurity is introduced into the channel region.

The ONO film 6 is an insulator film consisting of a multilayer structure of an oxide film 6a such as a silicon oxide film, a nitride film 6b such as a silicon nitride film and an oxide film 6c such as a silicon oxide film. The nitride film 6b included in the ONO film 6 serves as an electron trap insulator film (charge trap insulator film). Portions of the electron trap insulator film trapping electrons in particular are electron trap regions (charge trap regions).

The nitride film 6b is an insulator film, and hence trapped electrons hardly move in the nitride film 6b. When injected into portions close to both ends of the nitride film 6b, therefore, electrons can be stored in two portions of the nitride film 6b. In other words, two bits/one cell can be implemented. The gate electrode 7 can be formed by a polysilicon wire doped with an impurity, for example.

Figure 4:
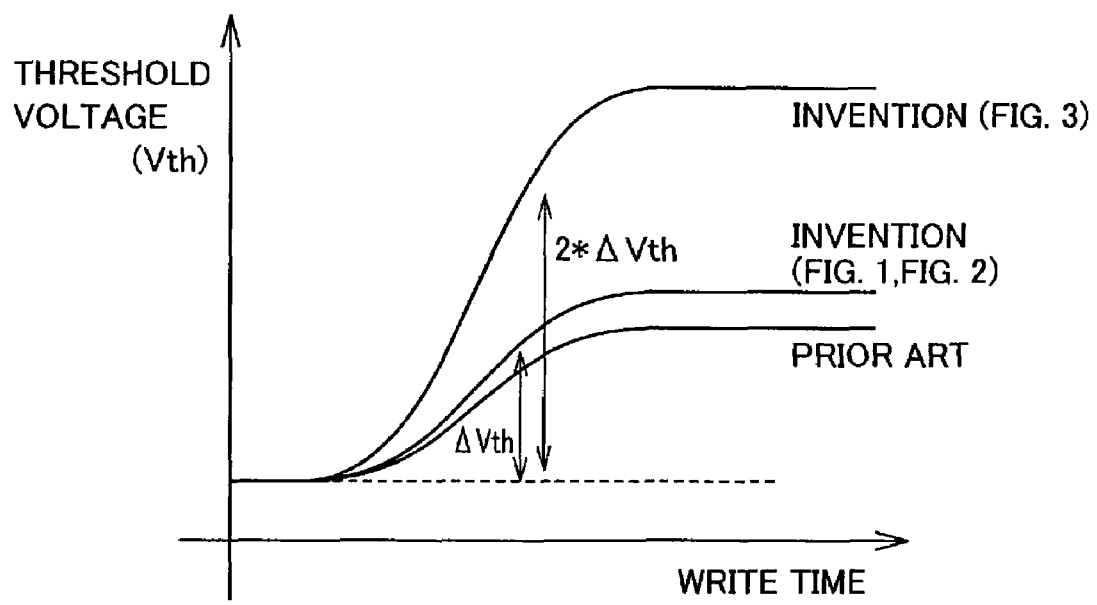
FIG. 4 illustrates the relation between a write (program) time and a threshold voltage Vth of the memory cell.
Figure 26:
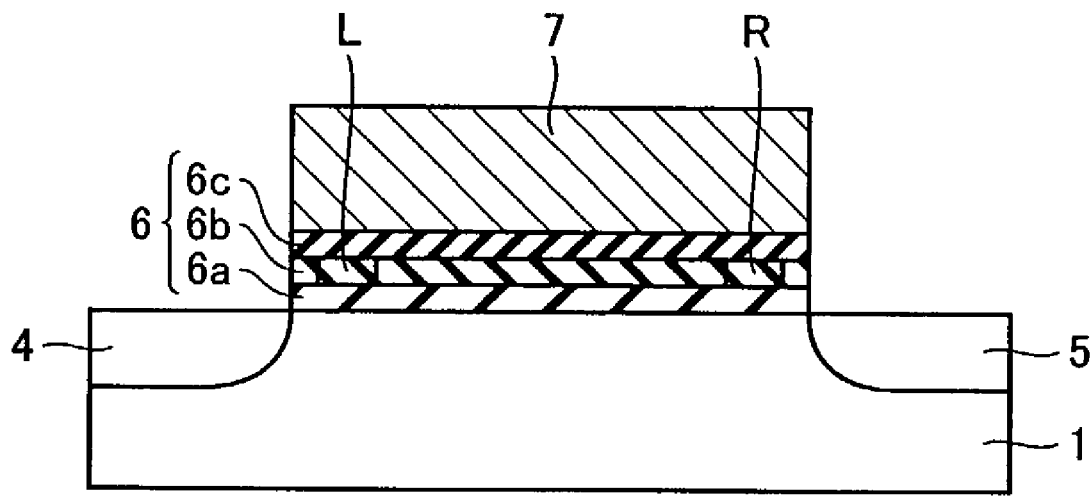
FIG. 26 is a sectional view showing another exemplary memory cell of a conventional nonvolatile semiconductor memory device.
Figure 27:
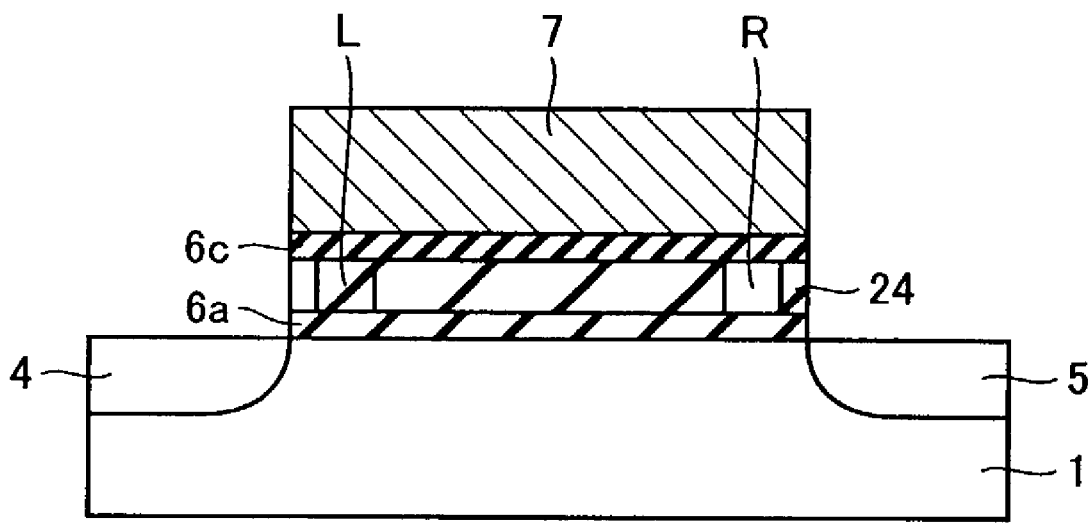
FIG. 27 is a sectional view showing still another exemplary memory cell of a conventional nonvolatile semiconductor memory device.
Figure 28:
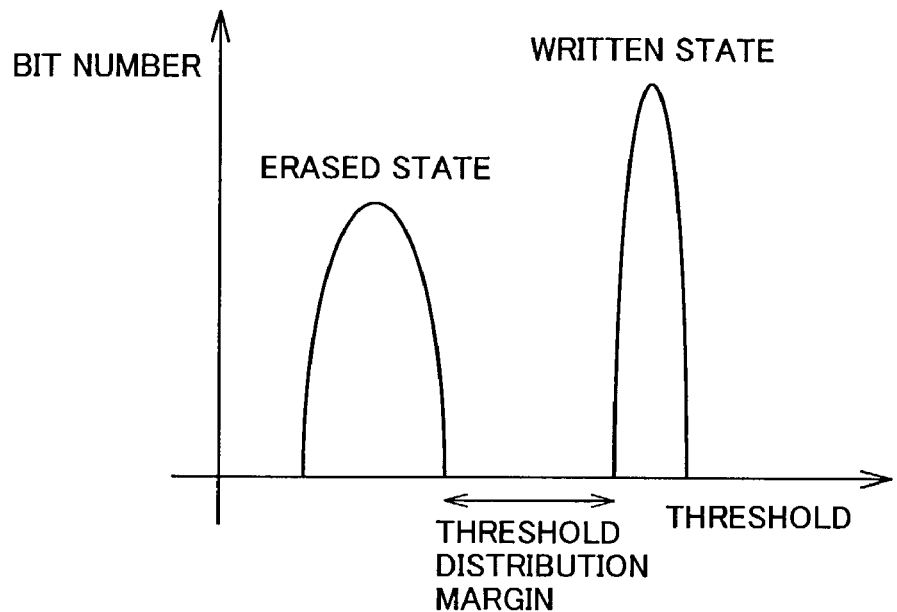
FIG. 28 illustrates a case where a distribution margin of a threshold voltage can be ensured.

In the memory cell having the SOI structure shown in FIG. 1, a memory cell current is larger than that of the prior art shown in FIG. 26. Therefore, the memory cell can trap a larger quantity of channel hot electrons, and a quantity of threshold voltage change (ΔVth) can be increased as compared with the prior art shown in FIG. 26, as shown in FIG. 4. The memory cell can also reduce a sub-leakage current as compared with the prior art due to the SOI structure, for reducing a standby current.

Operation of the MONOS memory cell shown in FIG. 1 is now described. Table 1 shows voltages applied to respective terminals for writing, reading and erasing data in, from and from the MONOS memory cell and the threshold voltage of the memory cell in reading. Data is written through channel hot electrons (CHE) and erased through an F-N (Fowler-Nordheim) tunneling phenomenon.

In order to inject electrons into an electron trap region in a first electron trap insulator film on the right side of the memory cell shown in FIG. 1, for example, voltages of 10 V and 5 V are applied to the gate electrode 7 and the drain region 5 respectively while a voltage of 0 V is applied to the source region 4 and the substrate 1 (B in Table 1) or the source region 4 and the substrate 1 are grounded. Thus, electrons flow from the source region 4 toward the drain region 5, and those converted to channel hot electrons in the vicinity of the drain region 5 are injected into the electron trap region of the nitride film 6b. The electrons injected into the nitride film 6b remain unmoving and hence two bits can be written in one cell by inverting source/drain.

In order to erase data, voltages of 0 V and 10 V are applied to the gate electrode 7 and the drain region 5 respectively while the source region 4 is brought into a floating state and a voltage of 0 V is applied to the substrate 1. Thus, electrons are extracted from the nitride film 6b through an F-N tunnel phenomenon. Thus, erasing is performed in units of bits.

Reading is performed on each of right and left bits. In order to read data from the right bit in the memory cell shown in FIG. 1, for example, a voltage of 3 V is applied to the gate electrode 7, a voltage of 0 V is applied to the drain region 5 and the substrate 1, and a voltage of 2 V is applied to the source region 4. If the focused right bit traps no electrons, the threshold voltage Vth of the memory cell is low (1.1 V) and a current flows to the memory cell. Whether or not data is written in the right bit can be determined by sensing this current.

Whether or not the left bit traps electrons, the threshold voltage of the memory cell is reduced if no data is written in the right bit while the threshold voltage is increased if data is written in the right bit. In other words, it is understood that data of the focused bit can be correctly read when the gate voltage is set to a prescribed value (e.g., 3 V), regardless of the data of the remaining bit. Data can be similarly read from the left bit according to Table 1.

Figure 2:
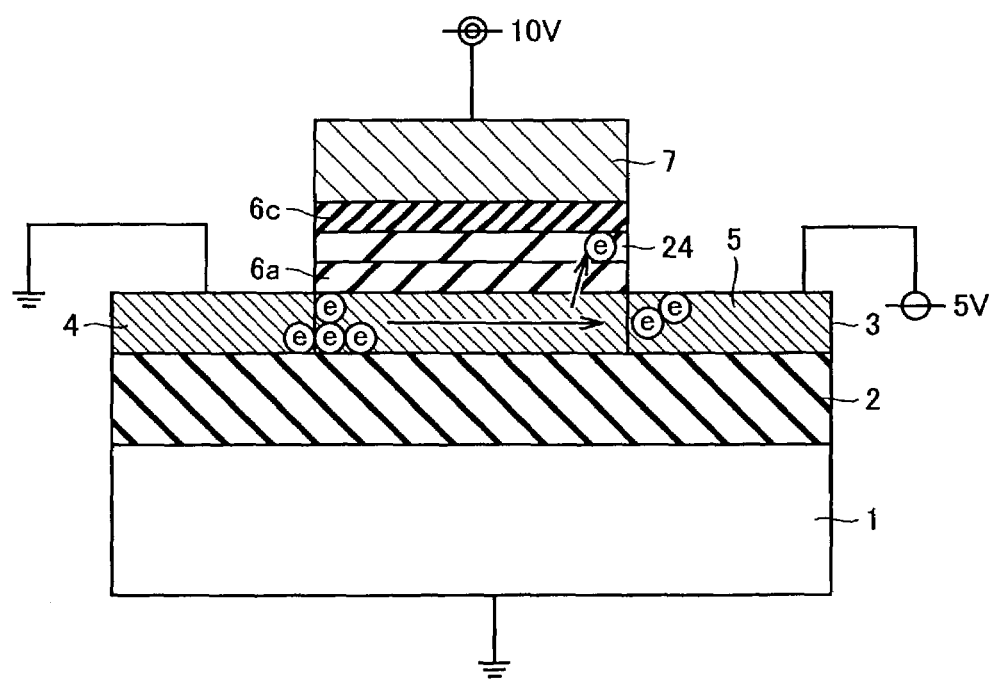
FIGS. 2 and 3 are sectional views of first and second modifications of the memory cell shown in FIG. 1.

FIG. 2 shows a first modification of the memory cell shown in FIG. 1. As shown in FIG. 2, an islandlike oxide film (silicon-containing oxide film) 24 containing silicon may be employed as an electron trap region, in place of the nitride film 6b. This oxide film 24 may be grown with a small thickness by LPCVD (low-pressure chemical vapor deposition), for example, at a prescribed temperature under a prescribed atmosphere containing $SiH_4$.

An effect similar to that of the memory cell shown in FIG. 1 can be expected in the modification shown in FIG. 2. In every one of the subsequent embodiments, the islandlike oxide film 24 containing silicon capable of trapping charges can be employed in place of a nitride film serving as an electron trap insulator film.

Figure 3:
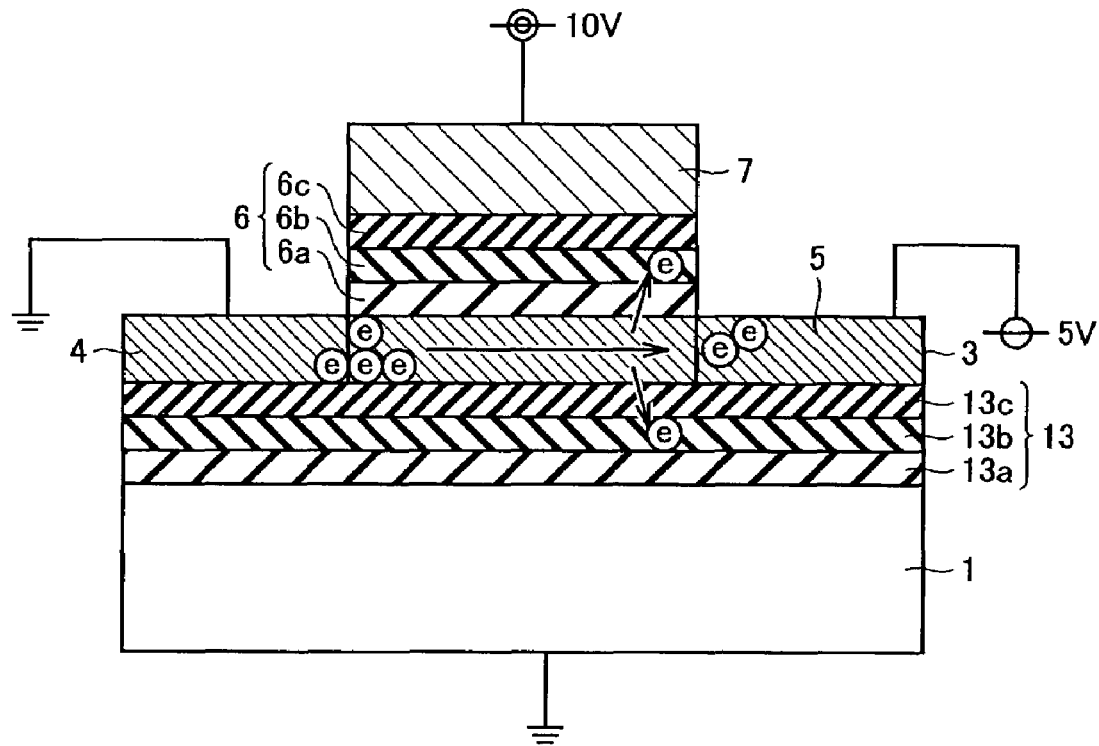

FIG. 3 shows a second modification of the memory cell shown in FIG. 1. As shown in FIG. 3, a buried insulator film is formed by an ONO film 13 in this modification. More specifically, the ONO film 13 is formed on the main surface

TABLE 1

| Operation | Access Bit | S(V) | D(V) | C(V) | B(V) | Vth(V) | State of Focused Bit | State of Remaining Bit |
|---|---|---|---|---|---|---|---|---|
| Write | R | 0 | 5 | 10 | 0 | — | — | — |
| Write | L | 5 | 0 | 10 | 0 | — | — | — |
| Erase | R | floating | 10 | 0 | 0 | — | — | — |
| Erase | L | 10 | floating | 0 | 0 | — | — | — |
| Read | R | 2 | 0 | 3 | 0 | 1 | 1(R: erased state) | 1(L: erased state) |
| Read | R | 2 | 0 | 3 | 0 | 1.1 | 1(R: erased state) | 0(L: written state) |
| Read | R | 2 | 0 | 3 | 0 | 4 | 0(R: written state) | 1(L: erased state) |
| Read | R | 2 | 0 | 3 | 0 | 4.2 | 0(R: written state) | 0(L: written state) |
| Read | L | 0 | 2 | 3 | 0 | 1 | 1(L: erased state) | 1(R: erased state) |
| Read | L | 0 | 2 | 3 | 0 | 1.1 | 1(L: erased state) | 0(R: written state) |
| Read | L | 0 | 2 | 3 | 0 | 4 | 0(L: written state) | 1(R: erased state) |
| Read | L | 0 | 2 | 3 | 0 | 4.2 | 0(L: written state) | 0(R: written state) | of a silicon substrate 1, and a silicon layer 3 is formed on the ONO film 13. The ONO film 13 is an insulator film consisting of a multilayer structure of an oxide film 13a, a nitride film 13b and an oxide film 13c for serving as the buried insulator film having an SOI structure, while part of the nitride film 13b forming a second charge trap insulator film defines a second electron trap region (second charge trap region). The remaining structure of this modification is similar to that shown in FIG. 1.

When potentials shown in FIG. 3 are applied to respective elements in order to write data in a right bit of the memory cell, for example, electrons flow through a channel region toward a drain region 5, while the electrons are scattered not only upward (toward a gate) but also downward (toward the substrate 1) in the vicinity of the drain region 5.

In the modification shown in FIG. 3, therefore, electron trap insulator films are provided not only above the channel region of the memory cell but also under the same, so that electrons scattered downward beyond the channel region can also be trapped. The electrons scattered under the channel region, which cannot be trapped in the memory cells shown in FIGS. 1 and 2, can also contribute to increase of the threshold voltage of the memory cell.

In other words, this modification can effectively utilized wastable electrons for further effectively increasing the threshold voltage of the memory cell as compared with those shown in FIGS. 1 and 2 under the same voltage application condition and the same write current, as shown in FIG. 4. For example, the memory cell according to the second modification can implement threshold voltage change (2ΔVth) twice the threshold voltage change (ΔVth) in the memory cell shown in FIGS. 1 or 2.

Figure 29:
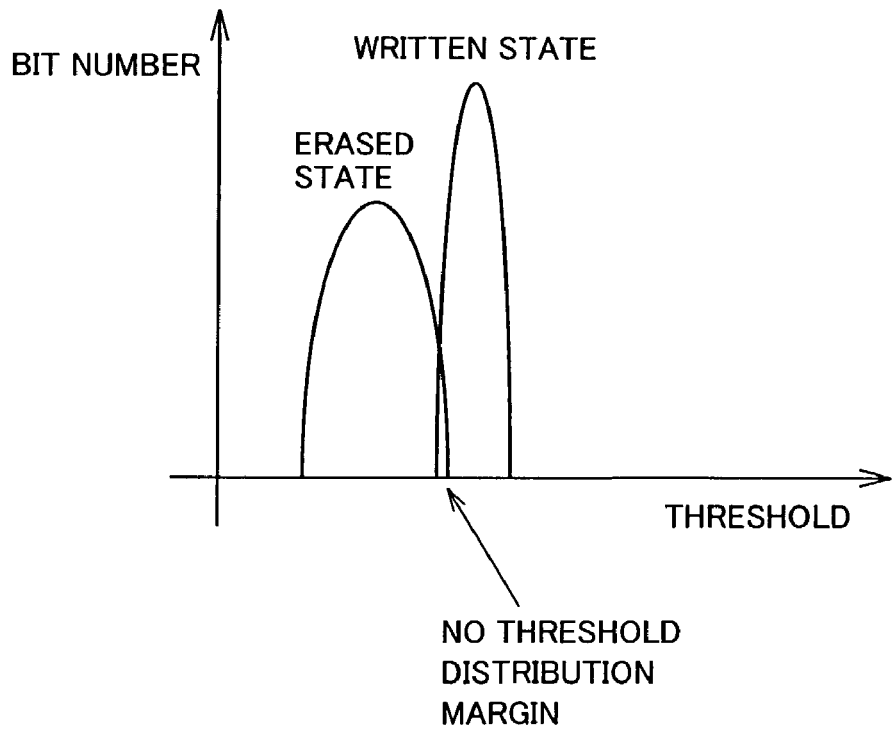
FIG. 29 illustrates a case where no distribution margin of a threshold voltage can be ensured.

As hereinabove described, each of the memory cells shown in FIGS. 1 to 3 can attain larger threshold voltage change as compared with the prior art shown in FIG. 26, whereby existence probability of products having the threshold voltage distribution shown in FIG. 29 is reduced and the yield can be improved.

A method of fabricating the nonvolatile semiconductor memory device having the aforementioned structure is now described.

In order to fabricate the device shown in FIG. 1, a substrate having an SOI structure is prepared by forming the silicon layer 3 on the silicon substrate 1 through the oxide film 2 by a well-known method. An element isolation region is formed on the silicon layer 3, and a prescribed impurity is injected into the region of the silicon layer 3 for defining the channel region.

The oxide film 6a, the nitride film 6b and the oxide film 6c are formed on the silicon layer 3 by CVD (chemical vapor deposition), for example, and a polysilicon film doped with an impurity is formed on the oxide film 6c by CVD or the like. A mask is formed on the polysilicon film by photolithography for selectively etching the polysilicon film, the oxide film 6c, the nitride film 6b and the oxide film 6a through the mask, thereby forming the ONO film 6 and the gate electrode 12. Thereafter an impurity having a different conductivity type from that of the impurity injected into the channel region is injected into the silicon layer 3 through the gate electrode 12 serving as a mask, for forming the source region 4 and the drain region 5.

In order to fabricate the device shown in FIG. 2, oxide film 24 containing the islandlike silicon may be formed in place of the nitride film 6b in the aforementioned method. In order to fabricate the device shown in FIG. 3, the ONO film 13 may be formed on the silicon substrate 1 by CVD or the like, and the silicon layer 3 may be formed on the ONO film 13 by a method described later.

(Second Embodiment)

A memory cell according to a second embodiment of the present invention and a modification thereof are now described with reference to FIGS. 5 to 7. The memory cell according to the second embodiment is an improvement of the memory cell shown in FIG. 3.

Figure 5:
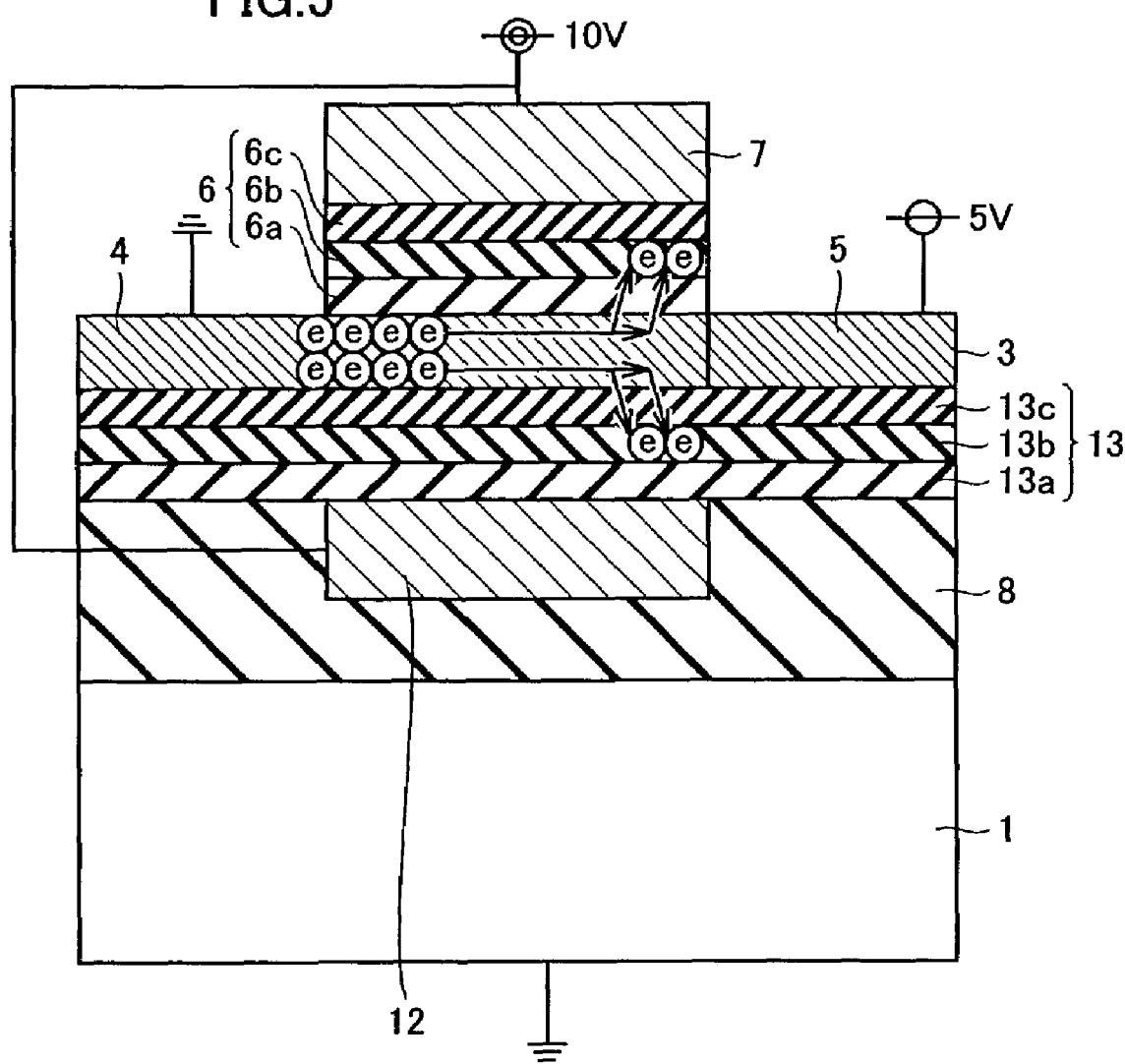
FIG. 5 is a sectional view of a memory cell of a nonvolatile semiconductor memory device according to a second embodiment of the present invention.

Vertical current density of a channel region in FIG. 5 depends on process/device parameters such as a channel dose, the thickness of a silicon layer 3, the thickness of an ONO film 6 etc. and design parameters such as a gate voltage and a drain voltage.

In the memory cell shown in FIG. 3, the potential for vertical electrons in the channel region may conceivably be reduced only in a portion immediately under the upper ONO film 6 and abruptly increased in the depth direction (downward or toward the substrate 1) of the channel region in writing. In this case, the electrons actually move only in the upper surface layer part of the channel region located immediately under the ONO film 6. This may result in such a situation that the upper nitride film 6b forming a first electron (charge) trap insulator film readily traps electrons while the lower nitride film 13b forming a second electron (charge) trap insulator film hardly traps electrons.

According to the second embodiment, therefore, a lower ONO film 13 is provided with an electrode part for attracting electrons. More specifically, electrode parts are provided on both of upper and lower insulator films (an upper ONO film 6 and the lower ONO film 13) having electron trap regions for attracting electrons to both electron trap regions so that the electron trap regions readily trap the electrons.

In the embodiment shown in FIG. 5, an insulator film 8 such as a silicon oxide film is formed on a silicon substrate 1, and a lower gate electrode 12 is formed in the insulator film 8. The lower gate electrode 12 is provided immediately under an upper gate electrode 7 and electrically connected thereto. The remaining structure of this embodiment is similar to that shown in FIG. 3.

Prescribed voltages are applied to respective elements of the aforementioned memory cell, as shown in FIG. 5. Thus, the potential for electrons is reduced in both of upper and lower portions of a channel region. In other words, the electrons are actually movable in both of the upper and lower portions of the channel region, as shown in FIG. 5. Therefore, a lower nitride film 13b can trap electrons substantially in the same quantity as an upper nitride film 6b, for more reliably attaining large threshold voltage change as shown in FIG. 7.

Figure 6:
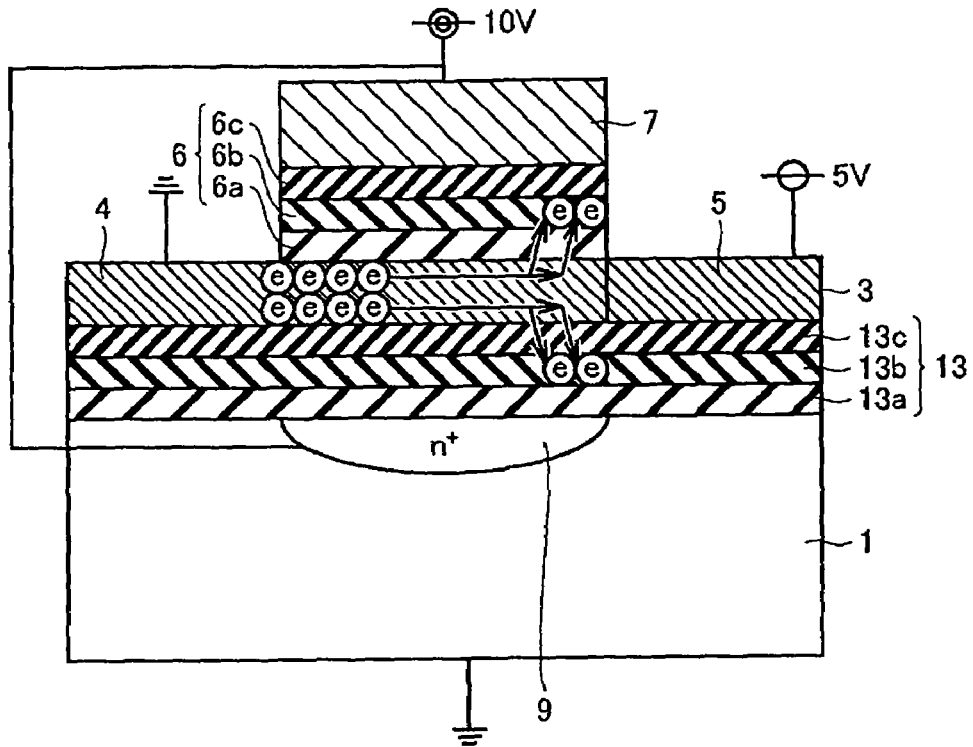
FIG. 6 is a sectional view of a modification of the memory cell shown in FIG. 5.
Figure 7:
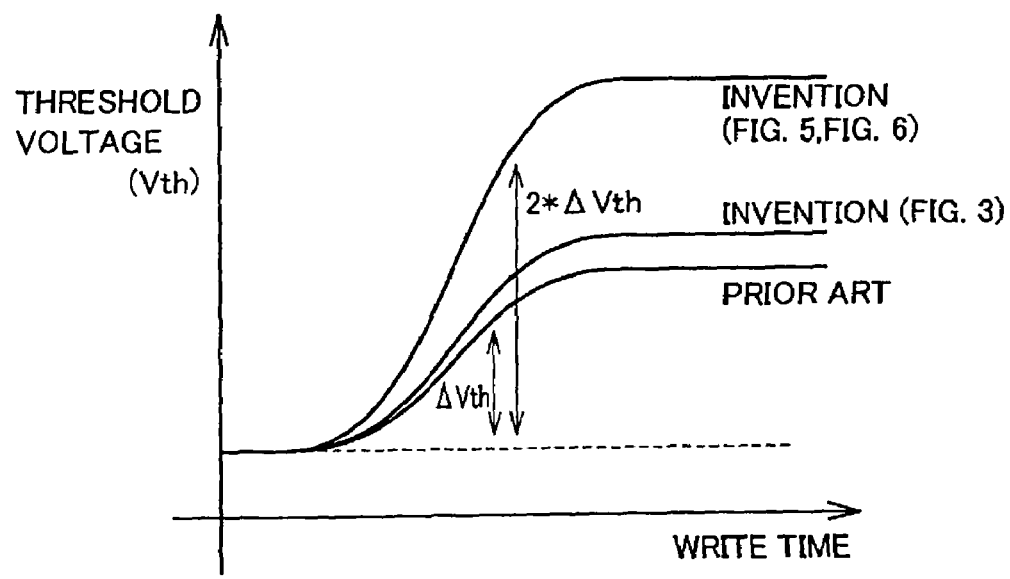
FIG. 7 illustrates the relation between a write (program) time and a threshold voltage Vth of the memory cell.

In the modification of the second embodiment shown in FIG. 6, an n$^+$ impurity diffusion region 9 is formed on the main surface of a silicon substrate 1. The concentration of an n-type impurity contained in the n$^+$ impurity diffusion region 9 is at least $1 \times 10^{20}$ (/cm$^3$) and not more than $1 \times 10^{22}$ (/cm$^3$), for example. The n$^+$ impurity diffusion region 9 is also electrically connected to a gate electrode 7. The remaining structure of this modification is similar to that shown in FIG. 3. Also in this case, the same voltage as that for the gate electrode 7 can be applied to the n$^+$ impurity diffusion region 9, and hence an effect similar to that of the second embodiment shown in FIG. 5 can be attained.

A method of fabricating a nonvolatile semiconductor memory device employing the memory cell according to the modification of the second embodiment is now described with reference to FIGS. 15 to 24.

Figure 15:
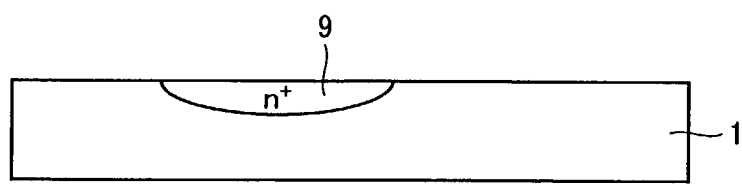
FIGS. 15 to 21 are sectional views showing first to seventh steps of a method of fabricating the nonvolatile semiconductor memory device shown in FIG. 6.

As shown in FIG. 15, arsenic (As) is selectively injected into the main surface of the silicon substrate 1 under conditions of 5 to 70 keV and $1\times10^{14}$ (/cm$^2$) to $4\times10^{15}$ (/cm$^2$), thereby forming the n$^+$ impurity diffusion region 9.

Figure 16:
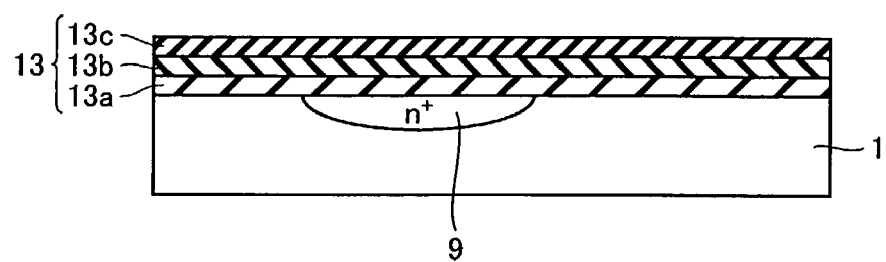
Figure 17:
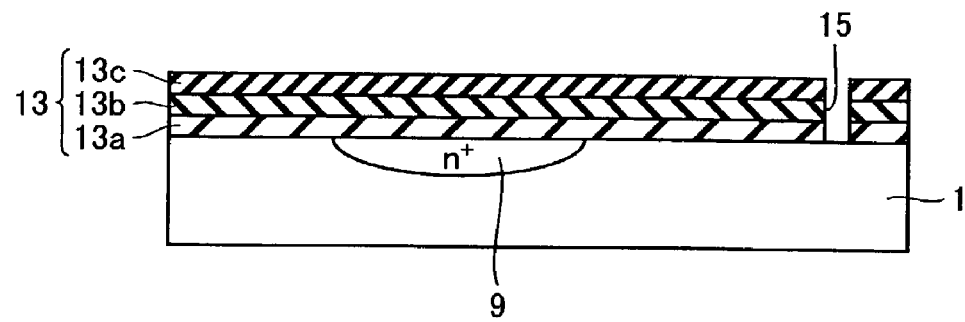

As shown in FIG. 16, an oxide film 13a, a nitride film 13b and an oxide film 13c are formed on the main surface of the silicon substrate 1 by CVD or the like. A mask (not shown) is selectively formed on the oxide film 13c for etching the oxide film 13a, the nitride film 13b and the oxide film 13c through this mask, thereby forming an opening 15 reaching the main surface of the silicon substrate 1, as shown in FIG. 17.

Figure 18:
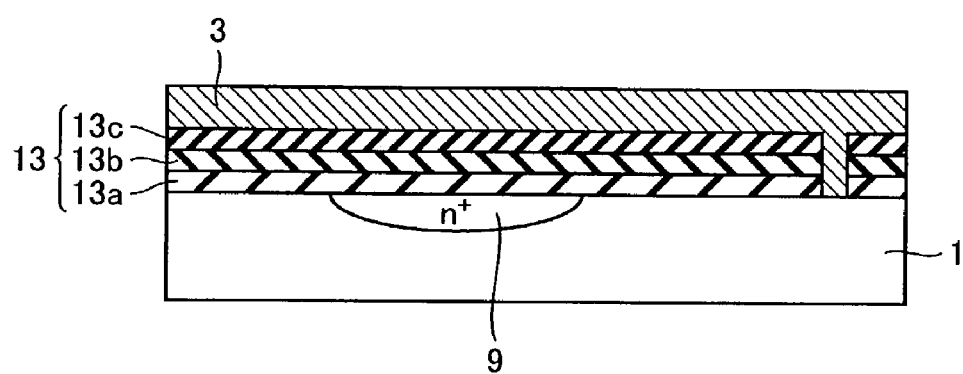
Figure 19:
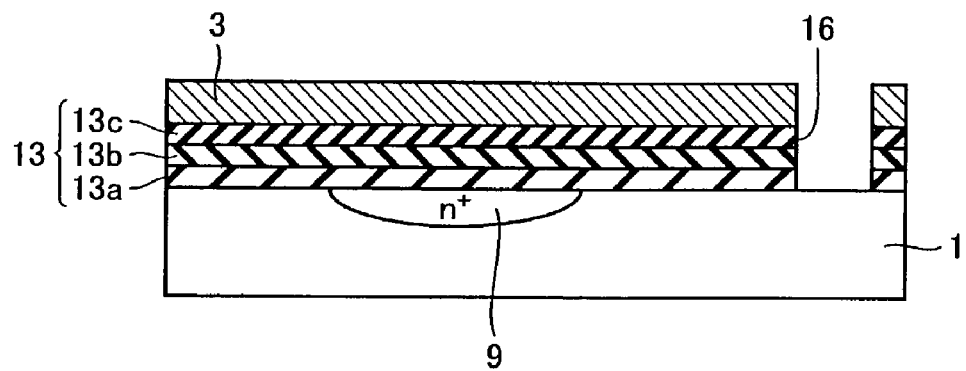

Then, heat treatment is performed on the silicon substrate 1 to grow a silicon layer from the silicon substrate 1, thereby forming a silicon layer 3 over the opening 15 and the oxide film 13c, as shown in FIG. 18. A mask (not shown) is selectively formed on this silicon layer 3 for etching the silicon layer 3, the oxide film 13a, the nitride film 13b and the oxide film 13c through the mask, thereby forming an opening 16 reaching the main surface of the silicon substrate 1, as shown in FIG. 19.

Figure 20:
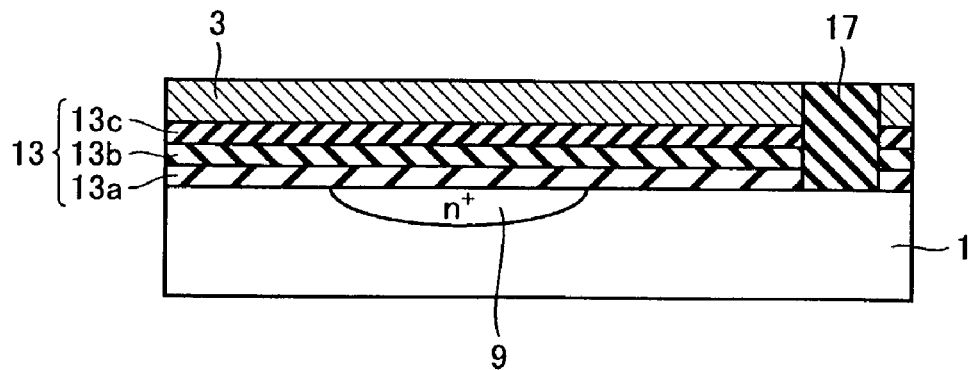
Figure 21:
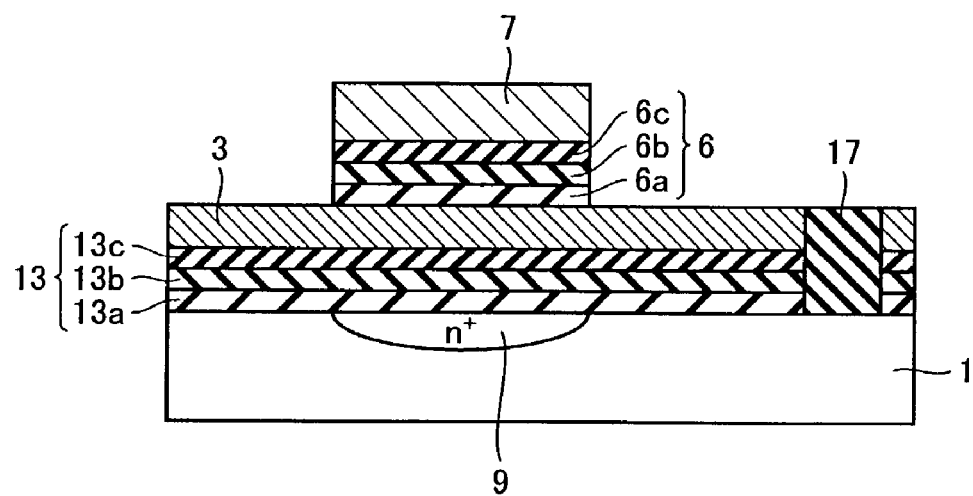

Then, an insulator film 17 such as a silicon oxide film is formed on the silicon layer 3 by CVD, to fill up the opening 16. This insulator film 17 is subjected to CMP (chemical mechanical polishing) or the like, to be embedded in the opening 16. Thereafter an ONO film 6 and the gate electrode 7 are formed followed by formation of a source region 4 and a drain region 5 by a method similar to that for the first embodiment, as shown in FIGS. 20 and 21. Thus, the memory cell of the nonvolatile semiconductor memory device can be formed as shown in FIG. 6.

Figure 22:
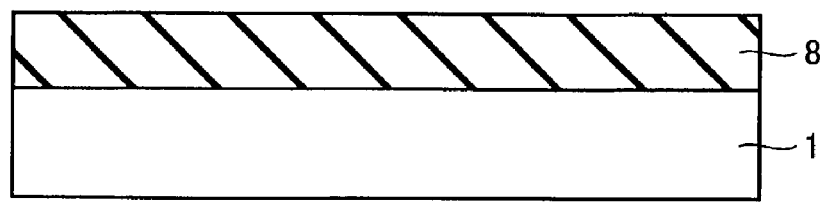
FIGS. 22 to 24 are sectional views showing first to third characteristic steps of a method of fabricating the nonvolatile semiconductor memory device shown in FIG. 5.
Figure 23:
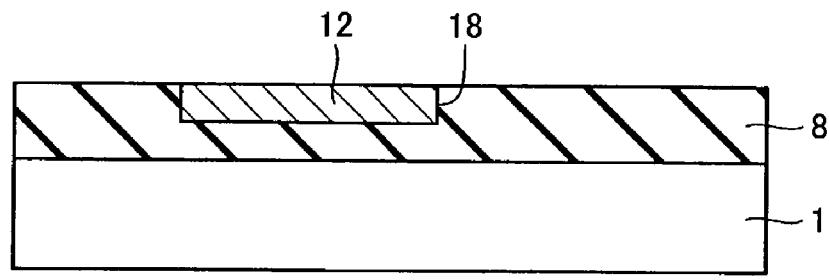

In order to fabricate the memory cell shown in FIG. 5, an insulator film 8 such as a silicon oxide film is deposited on the main surface of the silicon substrate 1 by CVD or the like, as shown in FIG. 22. This insulator film 8 is selectively etched for forming a trench (recess portion) 18 as shown in FIG. 23. A polysilicon film doped with an impurity is deposited on the insulator film 8 by CVD or the like, to be embedded in the trench 18. The lower gate electrode 12 can be formed by performing CMP or the like on the polysilicon film thereby embedding the same in the trench 18.

Figure 24:
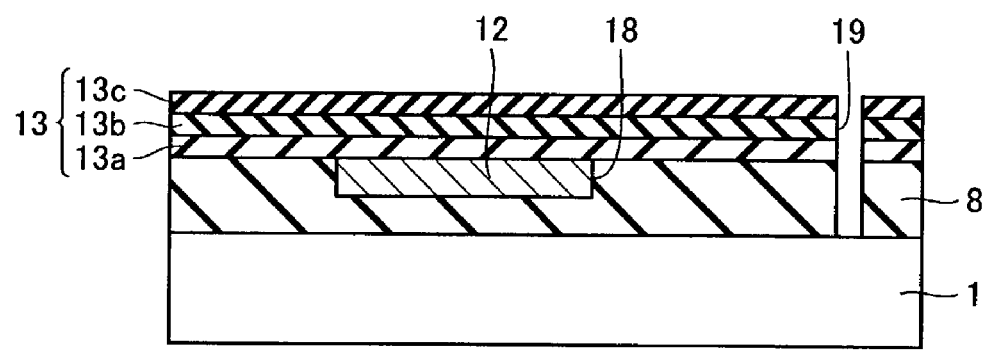
Figure 25:
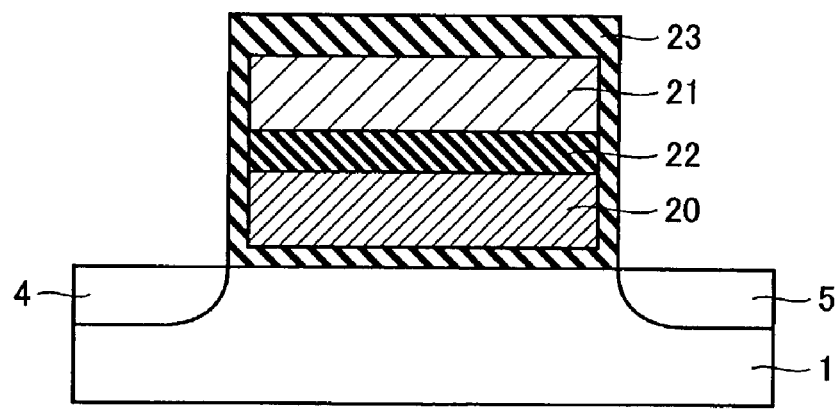
FIG. 25 is a sectional view showing an exemplary memory cell of a conventional nonvolatile semiconductor memory device.

Then, an oxide film 13a, a nitride film 13b and an oxide film 13c are deposited on the gate electrode 12 by CVD or the like, as shown in FIG. 24. Photolithography and etching are performed for forming an opening 19 reaching the silicon substrate 1 through the insulator film 8, the oxide film 13a, the nitride film 13b and the oxide film 13c. Thereafter the memory cell of the nonvolatile semiconductor memory device can be formed as shown in FIG. 5 by a method similar to that for the aforementioned modification shown in FIG. 6.

(Third Embodiment)

A memory cell according to a third embodiment of the present invention and a modification thereof are now described with reference to FIGS. 8 and 9. The memory cell according to this embodiment is an improvement of that according to the second embodiment.

In the aforementioned second embodiment, the same voltage is applied to the upper and lower gate electrodes 7 and 12 for increasing threshold voltage change of the memory cell. While the threshold voltage change is increased, however, the memory cell has two types of threshold voltages.

It is conceivable that three types of threshold voltages can be implemented when the threshold voltage change is increased. Therefore, the third embodiment of the present invention is described with reference to a technique of implementing a memory cell capable of attaining three types of threshold voltages, i.e., a memory cell of three values/electron storage region.

Figure 8:
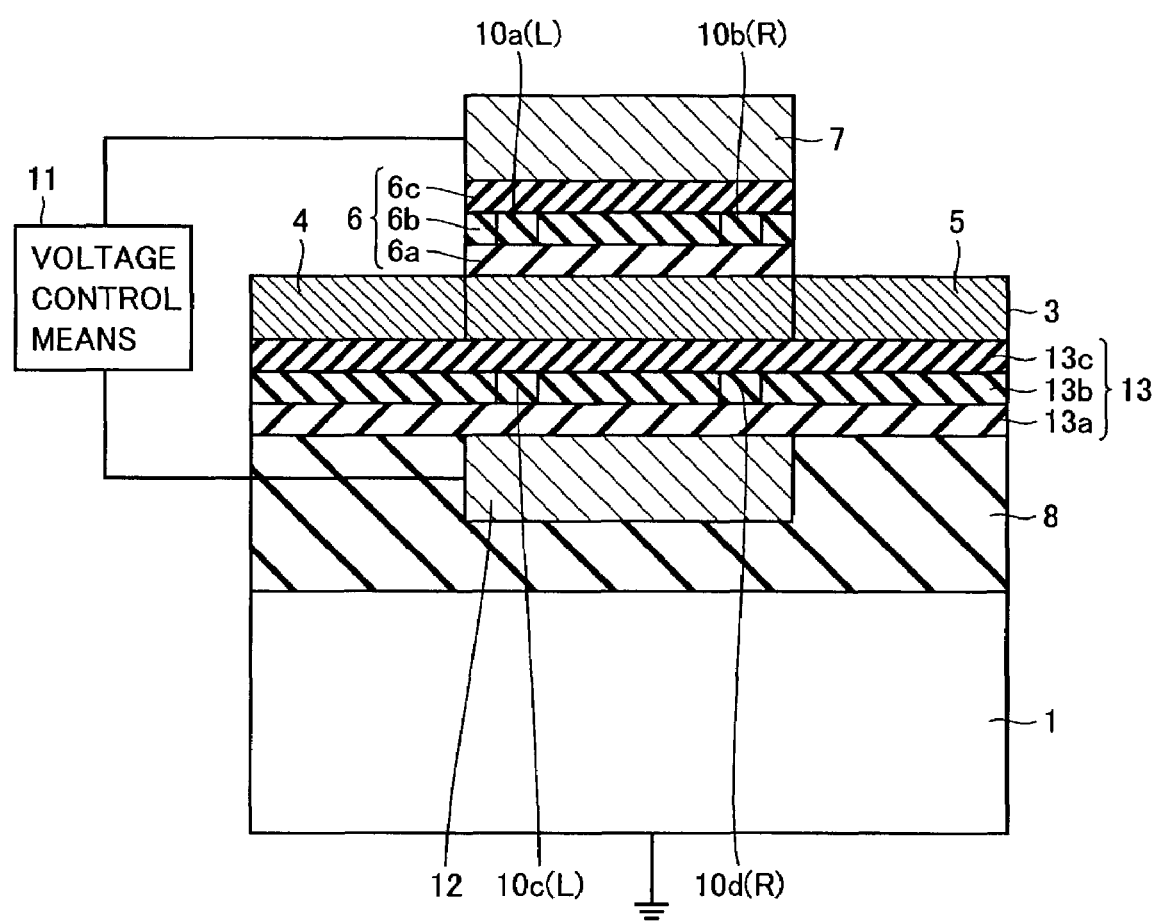
FIG. 8 is a sectional view of a memory cell of a nonvolatile semiconductor memory device according to a third embodiment of the present invention.

As shown in FIG. 8, voltage control means 11 is connected to upper and lower gate electrodes 7 and 12 in the memory cell according to the third embodiment. The voltage control means 11, individually controlling voltages applied to the gate electrodes 7 and 12 respectively, can apply not only the same voltage but also different voltages to the gate electrodes 7 and 12. The remaining structure of the memory cell shown in FIG. 8 is similar to that shown in FIG. 5.

Figure 9:
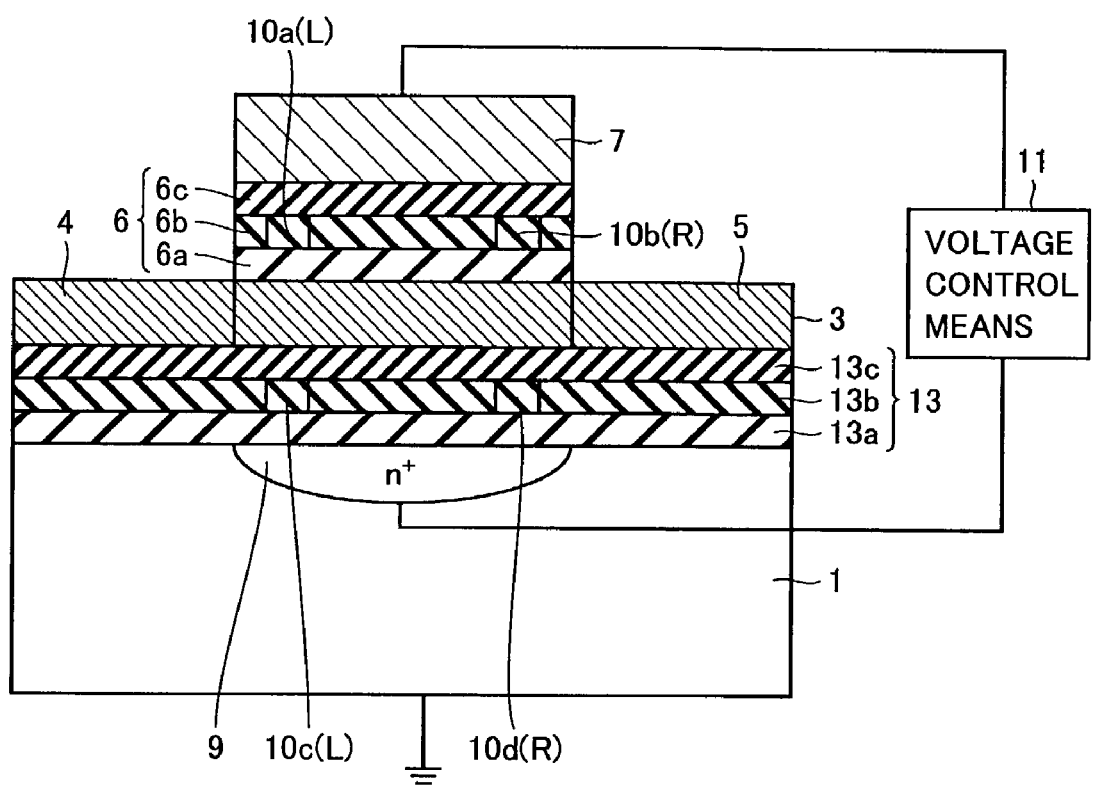
FIG. 9 is a sectional view of a modification of the memory cell shown in FIG. 8.

In the modification of the memory cell according to the third embodiment shown in FIG. 9, voltage control means 11 is connected to an n$^+$ impurity diffusion region 9 and a gate electrode 7 of a memory cell similar to that shown in FIG. 6 so that different voltages can be applied to the gate electrode 7 and the n$^+$ impurity diffusion region 9.

Table 2 shows voltages applied to the respective elements of the memory cell according to the third embodiment, and Tables 3 and 4 show states of right and left bits in the memory cell and current threshold voltages.

TABLE 2

| Operation | Access Bit | S(V) | D(V) | Upper G(V) | Lower G(V) |
|---|---|---|---|---|---|
| Write | R | 0 | 5 | 10 | 0 |
|  | R | 0 | 5 | 10 | 10 |
|  | L | 5 | 0 | 10 | 0 |
|  | L | 5 | 0 | 10 | 10 |
| Erase | R | floating | 10 | 0 | 0 |
|  | L | 10 | floating | 0 | 0 |
| Read | R1 | 2 | 0 | 3 | 0 |
|  | R2 | 2 | 0 | 5.5 | 0 |
|  | L1 | 0 | 2 | 3 | 0 |
|  | L2 | 0 | 2 | 5.5 | 0 |

As shown in Table 2 and FIG. 8, voltages of 10 V, 0 V and 5 V may be applied to the upper gate electrode 7, the lower gate electrode 12 and a source region 4 respectively, in order to inject electrons only into an upper right electron trap region 10b(R). In order to inject electrons only into a left electron trap region 10a(L), the voltages applied to the source region 4 and the drain region 5 may be replaced with each other.

In order to inject electrons into the right upper electron trap region 10b(R) and a right lower electron trap region 10d(R), voltages of 10 V, 0 V and 5 V may be applied to the upper and lower gate electrodes 7 and 12, the source region 4 and a drain region 5 respectively. In order to inject electrons into the left upper electron trap region 10a(L) and a left lower electron trap region 10c(L), the voltages applied to the source region 4 and the drain region 5 may be replaced with each other. The upper right and left electron trap regions 10b(R) and 10a(L) correspond to first electron trap regions, and the lower right and left electron trap regions 10d(R) and 10c(L) correspond to second electron trap regions.

As hereinabove described, the position of each electron trap region may be any of (a1) a region corresponding to the interface between the source region 4 or the drain region 5 and a channel region, (a2) a region reaching the source region 4 or the drain region 5 from a portion corresponding to the aforementioned interface and (a3) a region reaching the channel region from the portion corresponding to the aforementioned interface in plan view each of the aforementioned first and second charge trap insulator films. Alternatively, the regions (a1) to (a3) may be combined with each other.

In order to erase data from a right bit, a voltage of 0 V may be applied to the upper and lower gate electrodes 7 and 12 while bringing the source region 4 into a floating state and applying a voltage of 10 V to the drain region 5. In order to erase data from a left bit, the voltages applied to the source region 4 and the drain region 5 may be replaced with each other.

Reading is now described. Consider a case of reading data from the right electron trap regions 10b(R) and 10d(R). Referring to the row of R1 in Table 2, voltages of 3 V, 2 V and 0 V are applied to the upper gate electrode 7, the source region 4 and the lower gate electrode 12 as well as the drain region 5 respectively. If a current flows to the memory cell in this case, the data is '2'. If no current flows, voltages shown in the row of R2 are applied to the respective elements. If a current flows to the memory cell, the data is '1'. If no current flows in this case, the data is '0'.

Thus, a memory cell of three values/electron storage region can be implemented according to the third embodiment, whereby the degree of integration can be increased to 3/2 times as compared with the second embodiment.

TABLE 3

| CHE Injected/Non-Injected | | | | Read Voltage | | | Data |
|---|---|---|---|---|---|---|---|
| Upper Right | Lower Right | Upper Left | Lower Left | (Right Bit) | | | (Right) |
| | | | | S | D | Vth | |
| non-injected | non-injected | non-injected | non-injected | 2 | 0 | 1 | "2" |
| | | injected | non-injected | 2 | 0 | 1.1 | |
| | | injected | injected | 2 | 0 | 1.2 | |
| injected | non-injected | non-injected | non-injected | 2 | 0 | 4 | "1" |
| | | injected | non-injected | 2 | 0 | 4.1 | |
| | | injected | injected | 2 | 0 | 4.2 | |
| injected | injected | non-injected | non-injected | 2 | 0 | 7 | "0" |
| | | injected | non-injected | 2 | 0 | 7.1 | |
| | | injected | injected | 2 | 0 | 7.2 | |

As shown in Table 3, the threshold voltage Vth of the memory cell is reduced to 1 to 1.2 V when reading the data from the right bit if the upper and lower electron trap regions 10b(R) and 10d(R) of the right bit trap no electrons, whether or not the upper and lower trap regions 10a(L) and 10c(L) of the left bit trap electrons. The threshold voltage Vth of the memory cell reaches an intermediate value of 4 V to 4.2 V when reading data from the right bit if only the upper electron trap region 10b(R) of the right bit traps electrons, while the threshold voltage Vth of the memory cell is increased to 7 V to 7.2 V when reading data from the right bit if the upper and lower electron trap regions 10b(R) and 10d(R) of the right bit trap electrons.

TABLE 4

| CHE Injected/Non-Injected | | | | Read Voltage | | | Data |
|---|---|---|---|---|---|---|---|
| Upper Left | Lower Left | Upper Right | Lower Right | (Left Bit) | | | (Left) |
| | | | | D | S | Vth | |
| non-injected | non-injected | non-injected | non-injected | 2 | 0 | 1 | "2" |
| | | injected | non-injected | 2 | 0 | 1.1 | |
| | | injected | injected | 2 | 0 | 1.2 | |
| injected | non-injected | non-injected | non-injected | 2 | 0 | 4 | "1" |
| | | injected | non-injected | 2 | 0 | 4.1 | |
| | | injected | injected | 2 | 0 | 4.2 | |

TABLE 4-continued

| CHE Injected/Non-Injected | | | | Read Voltage | | | Data |
|---|---|---|---|---|---|---|---|
| Upper Left | Lower Left | Upper Right | Lower Right | (Left Bit) | | | (Left) |
| | | | | D | S | Vth | |
| injected | injected | non-injected | non-injected | 2 | 0 | 7 | "0" |
| | | injected | non-injected | 2 | 0 | 7.1 | |
| | | injected | injected | 2 | 0 | 7.2 | |

As shown in Table 4, the threshold voltage Vth of the memory cell is reduced to 1 V to 1.2 V when reading data from the left bit if the upper and lower left electron trap regions 10a(L) and 10c(L) trap no electrons, reaches an intermediate value of 4 V to 4.2 V when reading the left bit if only the upper left electron trap region 10a(L) traps electrons, and is increased to 7 V to 7.2 V when reading data from the left bit if the upper and lower left electron trap regions 10a(L) and 10c(L) trap electrons.

(Fourth Embodiment)

A memory cell according to a fourth embodiment of the present invention and a modification thereof are now described with reference to FIGS. 10 to 12. According to the fourth embodiment, the degree of contribution of the quantity of electrons trapped in electron trap regions to the threshold voltage is changed for implementing a memory cell of four values/electron storage region.

Figure 10:
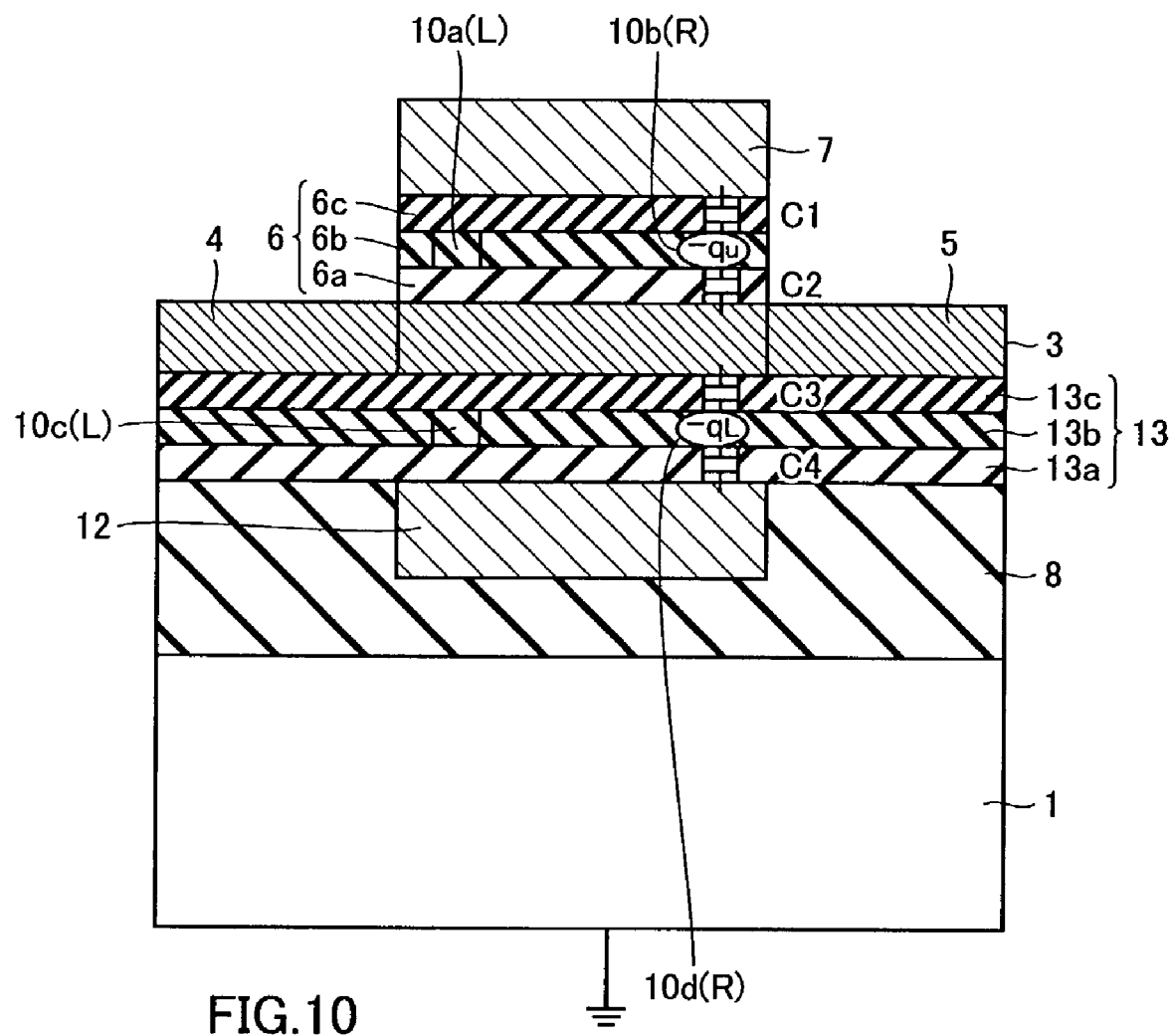
FIG. 10 is a sectional view of a memory cell of the same type as the memory cell shown in FIG. 8.

As shown in FIG. 10, capacitances C1, C2, C3 and C4 of oxide films 6a, 6c, 13a and 13c are equal to each other in a memory cell of the same type as that shown in FIG. 8. In this case, the degrees of contribution of quantities of electrons trapped in upper and lower electron trap regions to the threshold voltage are equal to each other, and hence a memory cell of three values/electron storage region can be implemented as in the third embodiment when the quantities of trapped electrons are equal to each other.

Figure 11:
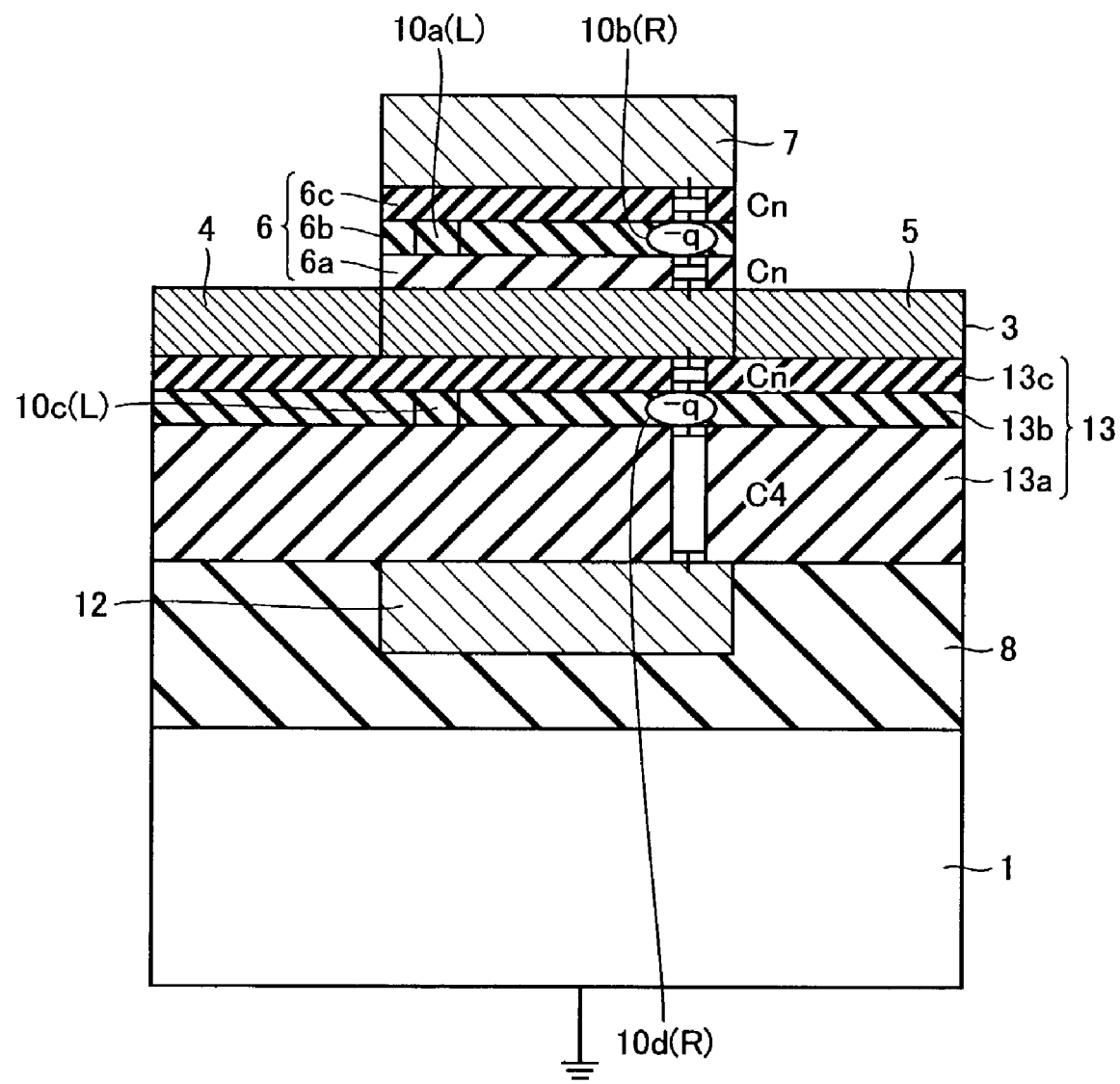
FIG. 11 is a sectional view of a memory cell of a nonvolatile semiconductor memory device according to a fourth embodiment of the present invention.
Figure 12:
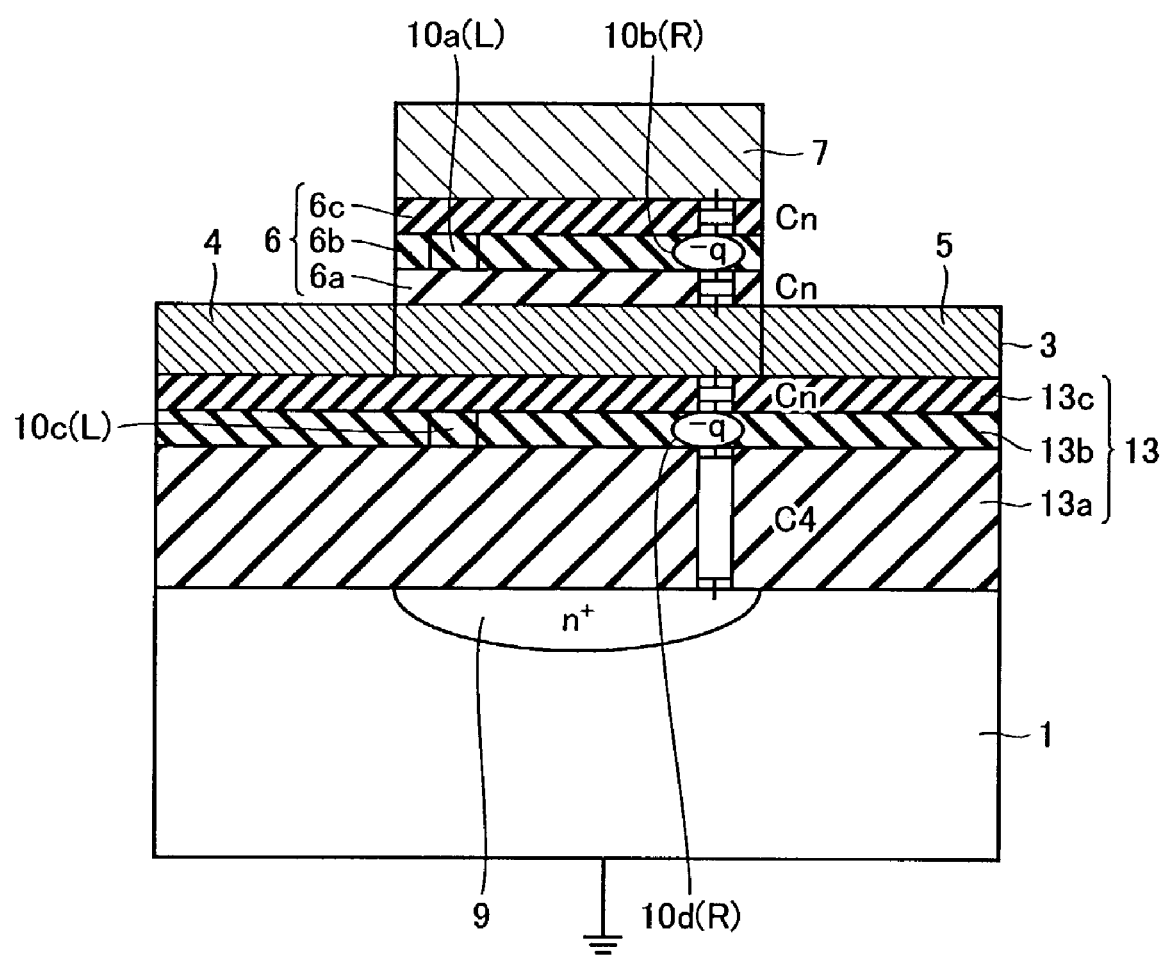
FIG. 12 is a sectional view of a modification of the memory cell shown in FIG. 11.

When setting capacitances C1, C2, C3 and C4 as C1=C2=C3=Cn and C4=Cn/9 as shown in FIG. 11, a memory cell can have four types of threshold voltages. In other words, four types of threshold voltages can be obtained by changing the capacitance of a prescribed portion, such as an oxide film 13a, for example, of an insulator film having an electron trap region.

The reason therefor is now described. Attention is focused on a right bit, and it is assumed that an upper region traps charges qu and a lower region trap charges ql. The capacitances between upper and lower electrodes in the vicinity of charge trap regions are C1, C2, C3 and C4 respectively. In this case, the threshold voltage (voltage applied to an upper gate electrode 7) Vth(qu,ql) of the memory cell for reading data from a right bit (with application of voltages of 2 V, 0 V and 0 V to a source region 4, a drain region 5 and a lower gate electrode 12 respectively) is expressed as follows:

$$Vth(qu, ql) = qu/C1 + (C3/(C4+C3)\times(1/C1+1/C2)) \quad (1)$$

$$ql + 2\times\phi f \times (1 + C3\times C4/(C3+C4)\times$$

$$(1/C1+1/C2))$$

$$= qu/C1 + (C3/(C4+C3)\times(1/C1+1/C2) + A$$

where φf represents a Fermi potential, and A is expressed as follows:

$$A = 2 \times \phi f \times (1 + C3 \times C4/(C3+C4) \times (1/C1 + 1/C2)) \quad (2)$$

Assuming that C1=C2=C3=Cn and C4=Cn/9, the voltage Vth(qu,ql) is expressed as follows:

$$Vth(qu, ql) = qu/C1 + C3/(C3+C4) \times (1/C1 + 1/C2) \times ql + A \quad (3)$$
$$= qu/Cn + 2/(C4+Cn) \times ql + A$$
$$= qu/Cn + 2/(Cn/9 + Cn) \times ql + A$$
$$= qu/Cn + 1.8 \times (ql/Cn) + A$$

From the formula (3), Vth(0,0)=A, Vth(q,0)=q/Cn+A, Vth(0,q)=1.8×(q/Cn)+A and Vth(q,q)=2.8×(q/Cn)+A, and a memory cell of four values/electron storage region (two bits/electron storage region and four bits/one cell) can be implemented. Therefore, the degree of integration can be doubled as compared with two bits/one cell.

The conditions for the thickness (d) of the oxide film 13c and the dielectric constant (ε) are now described.

Under conditions of C1=C2=C3=Cn=ε1×(S/d1) and C4=a×Cn=ε4×(S/d4), Vth(0,0)=A, Vth(q,0)=(q/Cn)+A, Vth (0,q)=2/(a+1)×(q/Cn)+A and Vth(q,q)=(q/Cn)+2/(a+1)×(q/Cn)+A as to Vth(qu,ql).

Hence, ΔVth32=Vth(q,q)−Vth(0,q)=(q/Cn), ΔVth21=Vth (0,q)−Vth(q,0)=((1−a)/(1+a))×(q/Cn) and ΔVth10=Vth(q, 0)−Vth(0,0)=(q/Cn).

At this time, it is appropriate that 0.7×(q/Cn)≦ΔVth21, since the threshold voltage ΔVth21 is distributed as shown in FIG. 29 if the same is excessively small.

Hence, a≦3/17, and C4≦(3/17)×Cn. Therefore, the thickness condition is d4≦(17/3)×d1 if the dielectric constants of the insulator films having the capacitances C1 and C4 are equal to each other, while the dielectric constant condition is ε4≦(3/17)ε1 if the thicknesses of the insulator films having the capacitances C1 and C4 are equal to each other. Thus, a memory cell of four values/electron storage region ca be implementing by properly adjusting the thickness or the dielectric constant of at least one in the insulator film portions located above and under the electron trap regions.

Tables 5 to 7 show the relations between charge trap states of the memory cell according to the fourth embodiment and threshold values.

TABLE 5

| Operation | Access Bit | S(V) | D(V) | Upper G(V) | Lower G(V) |
|---|---|---|---|---|---|
| Write | R | 0 | 5 | 10 | 0 |
|  | R | 0 | 5 | 0 | 12 |
|  | R | 0 | 5 | 10 | 12 |
|  | L | 5 | 0 | 10 | 0 |
|  | L | 5 | 0 | 0 | 12 |
|  | L | 5 | 0 | 10 | 12 |
| Erase | R | floating | 12 | 0 | 0 |
|  | L | 12 | floating | 0 | 0 |
| Read | R1 | 2 | 0 | 3 | 0 |
|  | R2 | 2 | 0 | 5.5 | 0 |
|  | R3 | 2 | 0 | 8 | 0 |
|  | L1 | 0 | 2 | 3 | 0 |
|  | L2 | 0 | 2 | 5.5 | 0 |
|  | L3 | 0 | 2 | 8 | 0 |

Writing, erasing and reading can be performed similarly to the aforementioned first to third embodiments by applying the voltages shown in Table 5 to the respective elements of the memory cell.

TABLE 6

| CHE Injected/Non-Injected | | | | Read Voltage | | | Data |
|---|---|---|---|---|---|---|---|
| Upper Right | Lower Right | Upper Left | Lower Left | (Right Bit) S | D | Vth | (Right) |
| non-injected | non-injected | non-injected | non-injected | 2 | 0 | 1 | "3" |
|  |  | injected | non-injected | 2 | 0 | 1.1 |  |
|  |  | non-injected | injected | 2 | 0 | 1.15 |  |
|  |  | injected | injected | 2 | 0 | 1.2 |  |
| injected | non-injected | non-injected | non-injected | 2 | 0 | 4 | "2" |
|  |  | injected | non-injected | 2 | 0 | 4.1 |  |
|  |  | non-injected | injected | 2 | 0 | 4.15 |  |
|  |  | injected | injected | 2 | 0 | 4.2 |  |
| non-injected | injected | non-injected | non-injected | 2 | 0 | 7 | "1" |
|  |  | injected | non-injected | 2 | 0 | 7.1 |  |
|  |  | non-injected | injected | 2 | 0 | 7.15 |  |
|  |  | injected | injected | 2 | 0 | 7.2 |  |
| injected | injected | non-injected | non-injected | 2 | 0 | 9 | "0" |
|  |  | injected | non-injected | 2 | 0 | 9.1 |  |
|  |  | non-injected | injected | 2 | 0 | 9.15 |  |
|  |  | injected | injected | 2 | 0 | 9.2 |  |

Consider a case of reading data from right electron trap regions 10b(R) and 10d(R). Referring to the row of R1 in Table 5, voltages of 3 V, 2 V and 0 V are applied to the upper gate electrode 7, the source region 4 and the lower gate electrode 12 as well as the drain region 5 respectively. If a current flows to the memory cell in this case, the data is '3'. If no current flows, voltages shown in the row of R2 are applied to the respective elements. If a current flows to the memory cell, the data is '2'. If no current flows in this case, voltages shown in the row or R3 are applied to the respective elements. If a current flows to the memory cell, the data is '1'. If no current flows in this case, the data is '0'.

TABLE 7

| CHE Injected/Non-Injected | | | | Read Voltage | | | Data |
|---|---|---|---|---|---|---|---|
| Upper Left | Lower Left | Upper Right | Lower Right | (Left Bit) S | D | Vth | (Left) |
| non-injected | non-injected | non-injected | non-injected | 0 | 2 | 1 | "3" |
|  |  | injected | non-injected | 0 | 2 | 1.1 |  |
|  |  | non-injected | injected | 0 | 2 | 1.15 |  |
|  |  | injected | injected | 0 | 2 | 1.2 |  |
| injected | non-injected | non-injected | non-injected | 0 | 2 | 4 | "2" |
|  |  | injected | non-injected | 0 | 2 | 4.1 |  |
|  |  | non-injected | injected | 0 | 2 | 4.15 |  |
|  |  | injected | injected | 0 | 2 | 4.2 |  |
| non-injected | injected | non-injected | non-injected | 0 | 2 | 7 | "1" |

TABLE 7-continued

| CHE Injected/Non-Injected | | | | Read Voltage (Left Bit) | | | Data (Left) |
|---|---|---|---|---|---|---|---|
| Upper Left | Lower Left | Upper Right | Lower Right | S | D | Vth | |
| | | injected | non-injected | 0 | 2 | 7.1 | |
| | | non-injected | injected | 0 | 2 | 7.15 | |
| | | injected | injected | 0 | 2 | 7.2 | |
| injected | injected | non-injected | non-injected | 0 | 2 | 9 | "0" |
| | | injected | non-injected | 0 | 2 | 9.1 | |
| | | non-injected | injected | 0 | 2 | 9.15 | |
| | | injected | injected | 0 | 2 | 9.2 | |

Also as to a case of reading data from left electron trap regions 10*a*(L) and 10*c*(L), the basic idea is similar to that for the case of reading data from the right electron trap regions 10*b*(R) and 10*d*(R).

(Fifth Embodiment)

A memory cell according to a fifth embodiment of the present invention and a modification thereof are now described with reference to FIGS. 13 and 14. The feature of the fifth embodiment resides in that the memory cell has no upper electron trap region. Also in this case, threshold voltage change can be ensured similarly to the memory cell shown in FIG. 1. Further, no electron trap region may be provided under an upper gate electrode 7, to which no high voltage is applied when data is written in or erased from the memory cell. Therefore, the thickness of an insulator film 14 located under the upper gate electrode 7 can be reduced for rendering the process of forming the insulator film 14 in common with the so-called logic CMOS (complementary metal-oxide semiconductor) process.

Figure 13:
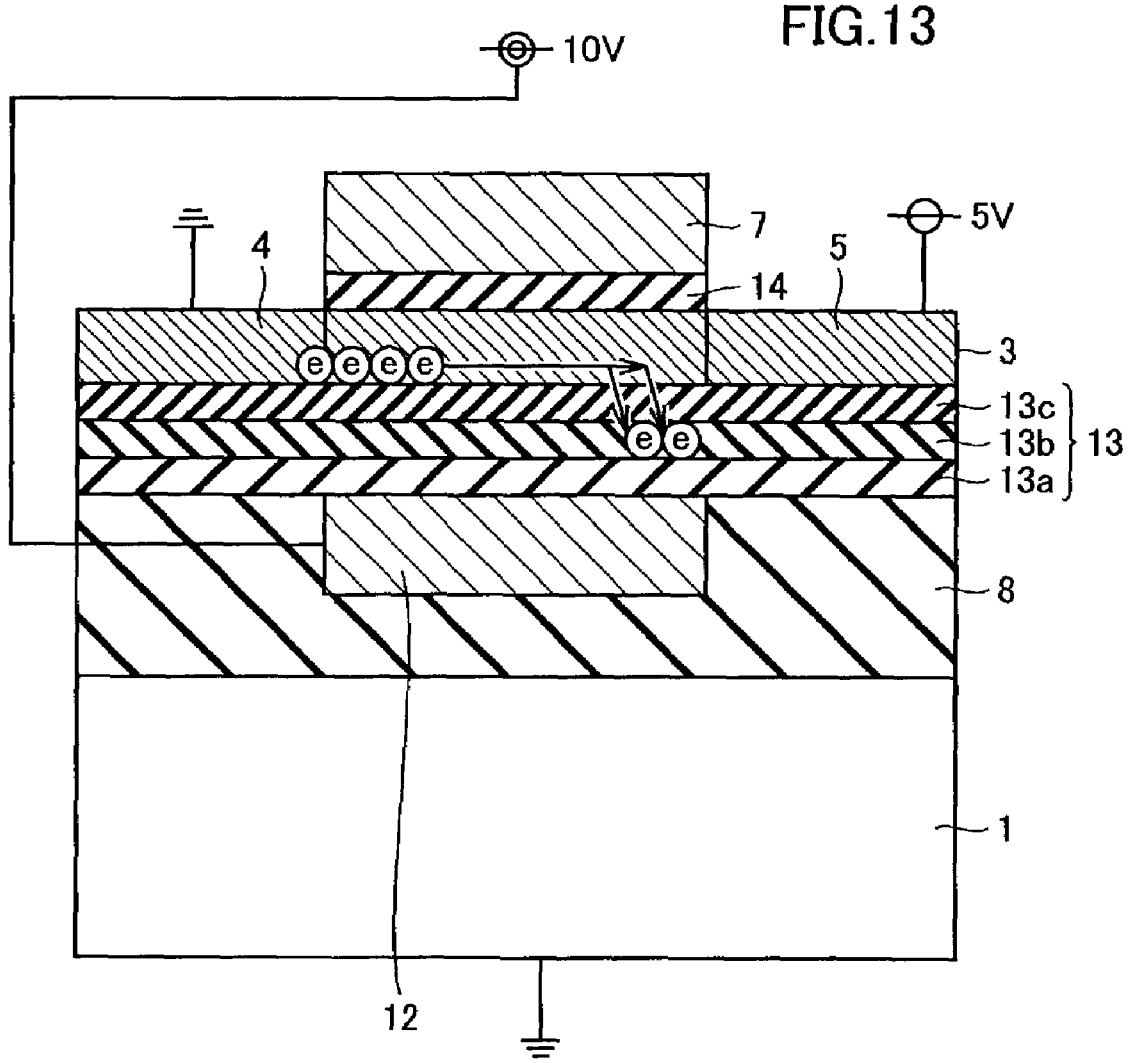
FIG. 13 is a sectional view of a memory cell of a nonvolatile semiconductor memory device according to a fifth embodiment of the present invention.

As shown in FIG. 13, an ONO film 13, an insulator film 8 and a lower gate electrode 12 are formed under a silicon layer 3, while the gate electrode 7 is formed on the silicon layer 3 through the thin insulator film 14. Electrons can be trapped in a nitride film 13*b* forming the ONO film 13 by applying a voltage of 10 V to the lower gate electrode 12.

While the upper gate electrode 7 has no direct concernment with writing or erasing of the memory cell, the operation of the memory cell can be stabilized and a leakage current can be suppressed by fixing the potential of the upper gate electrode 7 to a ground potential, for example. Further, formation of the upper gate electrode 7 may be omitted.

Figure 14:
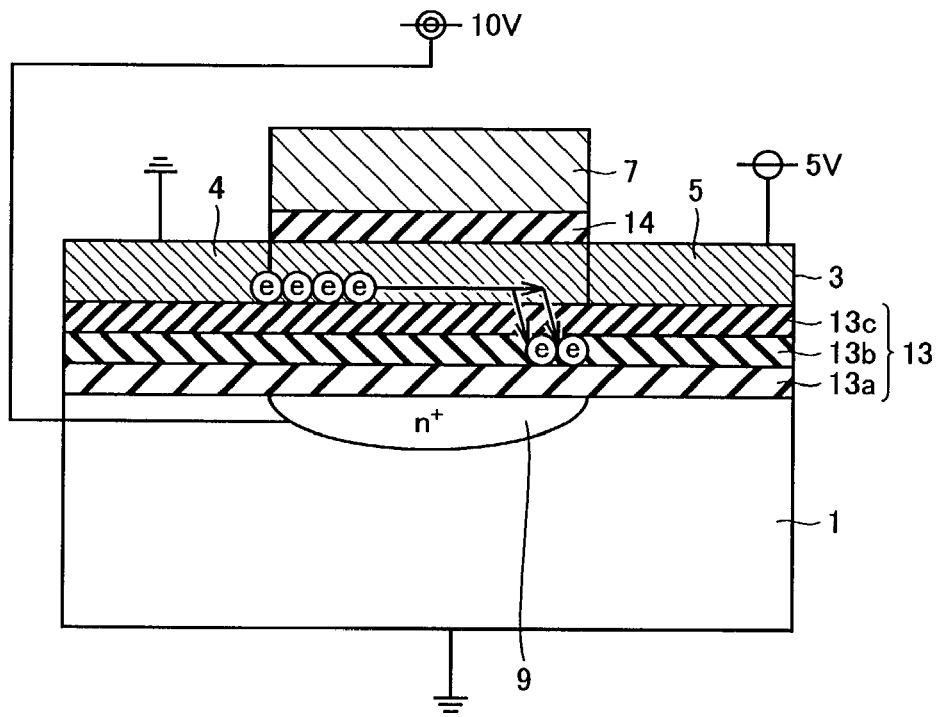
FIG. 14 is a sectional view of a modification of the memory cell shown in FIG. 13.

In a modification of the memory cell according to the fifth embodiment shown in FIG. 14, an n$^+$ impurity diffusion region 9 is provided in place of the lower gate electrode 12 shown in FIG. 13. The n$^+$ impurity diffusion region 9 is provided immediately under a gate electrode 7, so that data is written in or erased from the memory cell by applying a prescribed voltage to the n$^+$ impurity diffusion region 9.

Tables 8 to 10 show voltages applied to respective terminals in writing, erasing and reading of the memory cell according to the fifth embodiment and threshold voltages of the memory cell. The operation of the memory cell is basically similar to that in the first embodiment.

TABLE 8

| Operation | Access Bit | S(V) | D(V) | Upper G(V) | Lower G(V) |
|---|---|---|---|---|---|
| Write | R | 0 | 5 | 0 | 10 |
| | L | 5 | 0 | 0 | 10 |
| Erase | R | floating | 10 | 0 | 0 |
| | L | 10 | floating | 0 | 0 |
| Read | R2 | 2 | 0 | 0 | 3 |
| | L2 | 0 | 2 | 0 | 3 |

TABLE 9

| CHE Injected/Non-Injected | | Read Voltage (Right Bit) | | | Data (Right) |
|---|---|---|---|---|---|
| Lower Right | Lower Left | S | D | Vth | |
| non-injected | non-injected | 2 | 0 | 1 | "1" |
| | injected | 2 | 0 | 1.1 | |
| injected | non-injected | 2 | 0 | 4 | "0" |
| | injected | 2 | 0 | 4.1 | |

TABLE 10

| CHE Injected/Non-Injected | | Read Voltage (Left Bit) | | | Data (Left) |
|---|---|---|---|---|---|
| Lower Left | Lower Right | S | D | Vth | |
| non-injected | non-injected | 0 | 2 | 1 | "1" |
| | injected | 0 | 2 | 1.1 | |
| injected | non-injected | 0 | 2 | 4 | "0" |
| | injected | 0 | 2 | 4.1 | |

The features of the embodiments of the present invention described above can be combined with each other.

According to the present invention, the quantity of threshold voltage change of the memory cell can be increased, whereby a large threshold voltage distribution margin can be ensured for improving the yield. Further, the quantity of movable carriers can be increased due to the SOI structure, thereby improving the drivability of the memory cell. In addition, the operating speed of the memory cell can be increased and power consumption can be reduced. Further, the quantity of the current can be reduced in a standby state of the memory cell.

When an insulator film such as a nitride film or a silicon-containing oxide film is employed as a film (charge storage insulator film) having a charge trap region, trapped electrons remain unmoving in this film and hence each memory cell can store information of two bits.

When a lower insulator film has a second charge storage insulator film, both of first and second charge storage insulator films can trap charges. Therefore, large threshold voltage change can be more reliably implemented.

When a lower electrode is provided for trapping charges in a charge trap film, the charges can be guided to a second charge trap insulator film to be stored therein by applying a prescribed voltage to the lower electrode.

When the electric capacitance of at least one of insulator films located above and under first and second charge storage insulator films is different from that of the remaining film, the memory cell can obtain four types of threshold voltages as shown in Tables 6 and 7, for example, for implementing four values/electron storage region for storing information of four bits in each memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device including a memory cell, comprising:
   a semiconductor substrate;
   a semiconductor layer, located above said semiconductor substrate, including a source region, a channel region and a drain region of said memory cell;
   a lower insulator film located between said semiconductor substrate and said semiconductor layer, said lower insulator film includes a charge trap insulator film capable of trapping charges;
   an insulator film on said channel region, wherein said insulator film includes a multilayer structure of a first insulator film, a first charge trap insulator film capable of trapping charges and second insulator film,
   wherein said lower insulator film has a multilayer structure of a third insulator film, a second charge trap insulator film for trapping charges and a fourth insulator film,
   first charge trap regions trapping charges in a region including a portion corresponding to the boundary between said source region and said channel region and a region including a portion corresponding to the boundary between said drain region and said channel region in said first charge trap insulator film while having second charge trap regions trapping charges in a region including a portion corresponding to the boundary between said source region and said channel region and a region including a portion corresponding to the boundary between said drain region and said channel region in said second charge trap insulator film.

2. The nonvolatile semiconductor memory device according to claim 1, further including a gate electrode of said memory cell on said insulator film for applying a potential to said first charge trap insulator film for trapping charges.

3. The nonvolatile semiconductor memory device according to claim 1, wherein
   at least either said first charge trap insulator film or said second charge trap insulator film is made of a nitride film.

4. The nonvolatile semiconductor memory device according to claim 1, wherein, each layer of said multilayer structure has a region having trapped charges,
   an amount of the trapped charges of at least one of said first, second, third and fourth insulator films is different from an amount of the trapped charges of remaining said insulator films.

5. The nonvolatile semiconductor memory device according to claim 1, further comprising a lower electrode for applying a potential to said second charge trap insulator film for trapping charges.

6. The nonvolatile semiconductor memory device according to claim 5, wherein
   said lower electrode includes a polysilicon film or an impurity diffusion region.

7. The nonvolatile semiconductor memory device according to claim 1, wherein four bits of information are stored in one said memory cell.

8. A nonvolatile semiconductor memory device including a memory cell, comprising:
   a semiconductor substrate;
   a semiconductor layer, located above said semiconductor substrate, including a source region, a channel region and a drain region of said memory cell;
   a lower insulator film located between said semiconductor substrate and said semiconductor layer;
   a pate located above said semiconductor layer;
   a lower electrode located between the lower insulator film; and
   substrate and a voltage control means electrically connected to both the gate electrode and the lower electrode, wherein
   said lower insulator film includes a multilayer structure of a first insulator film, a charge trap insulator film capable of trapping charges and a second insulator film.

9. The nonvolatile semiconductor memory device according to claim 8, wherein
   said charge trap insulator film is a nitride film.

10. The nonvolatile semiconductor memory device according to claim 8, further including a lower electrode applying a potential to said charge trap insulator film for trapping charges.

11. The nonvolatile semiconductor memory device according to claim 10, wherein
   said lower electrode includes a polysilicon film or an impurity diffusion region.

12. The nonvolatile semiconductor memory device according to claim 8, including charge trap regions trapping charges in a region including a portion corresponding to the boundary between said source region and said channel region and a region including a portion corresponding to the boundary between said drain region and said channel region in said charge trap insulator film.

13. The nonvolatile semiconductor memory device according to claim 1, further comprising a gate located above said insulator film, a lower electrode located between the lower insulator film and substrate and a voltage control means electrically connected to both the gate electrode and the lower electrode.

* * * * *